United States Patent
Xu et al.

(10) Patent No.: US 12,094,767 B2
(45) Date of Patent: Sep. 17, 2024

(54) BARRIER LAYERS FOR WORD LINE CONTACTS IN A THREE-DIMENSIONAL NAND MEMORY AND FABRICATION METHODS THEREOF

(71) Applicant: Yangtze Memory Technologies Co., Ltd., Hubei (CN)

(72) Inventors: Ling Xu, Hubei (CN); Di Wang, Hubei (CN); Zhong Zhang, Hubei (CN); Wenxi Zhou, Hubei (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 354 days.

(21) Appl. No.: 17/580,051

(22) Filed: Jan. 20, 2022

(65) Prior Publication Data
US 2023/0197507 A1 Jun. 22, 2023

Related U.S. Application Data

(63) Continuation of application No. PCT/CN2021/140362, filed on Dec. 22, 2021.

(51) Int. Cl.
*H01L 21/768* (2006.01)
*H01L 23/528* (2006.01)
*H01L 23/535* (2006.01)

(52) U.S. Cl.
CPC .. *H01L 21/76832* (2013.01); *H01L 21/76805* (2013.01); *H01L 21/76816* (2013.01);
(Continued)

(58) Field of Classification Search
CPC ......... H01L 21/76832; H01L 21/76805; H01L 21/76816; H01L 21/76895; H01L 23/5283;
(Continued)

(56) References Cited

U.S. PATENT DOCUMENTS

| | | | |
|---|---|---|---|
| 9,824,966 B1 | 11/2017 | Kanakamedala et al. | |
| 2009/0267135 A1 | 10/2009 | Tanaka et al. | |

(Continued)

FOREIGN PATENT DOCUMENTS

| | | |
|---|---|---|
| CN | 109716521 A | 5/2019 |
| CN | 112106193 A | 12/2020 |

OTHER PUBLICATIONS

International Search Report directed to related International Patent Application No. PCT/CN2021/140362, mailed Sep. 14, 2022 (4 pages).

*Primary Examiner* — Shahed Ahmed
*Assistant Examiner* — Vicki B. Booker
(74) *Attorney, Agent, or Firm* — Conley Rose, P.C.

(57) ABSTRACT

The present disclosure provides a method for forming a three-dimensional memory device. The method includes disposing an alternating dielectric stack on a substrate in a first direction perpendicular to the substrate; and forming a staircase structure and a dividing wall in the alternating dielectric stack. The staircase structure and the dividing wall extend in a second direction parallel to the substrate, and the dividing wall is adjacent to the staircase structure. The method also includes forming, sequentially on the staircase structure, a first barrier layer and a second barrier layer different from the first barrier layer. The method further includes forming a gate line slit (GLS) opening in the dividing wall. The GLS opening penetrates through the alternating dielectric stack in the first direction and is distant from the second barrier layer in a third direction that is parallel to the substrate and is perpendicular to the second direction.

7 Claims, 28 Drawing Sheets

(52) U.S. Cl.
CPC .... *H01L 21/76895* (2013.01); *H01L 23/5283* (2013.01); *H01L 23/535* (2013.01)

(58) Field of Classification Search
CPC ....... H01L 23/535; H10B 43/10; H10B 43/50; H10B 43/27; H10B 43/35; H10B 41/35; H10B 41/27; H10B 41/50
See application file for complete search history.

(56) References Cited

U.S. PATENT DOCUMENTS

| | | | |
|---|---|---|---|
| 2012/0070944 A1 | 3/2012 | Kim et al. | |
| 2016/0322297 A1* | 11/2016 | Kim | H10B 41/50 |
| 2017/0170193 A1* | 6/2017 | Lee | H10B 41/27 |
| 2020/0194447 A1 | 6/2020 | Sun et al. | |
| 2021/0134827 A1* | 5/2021 | Iwai | H10B 43/27 |
| 2022/0028440 A1 | 1/2022 | Tang | |

* cited by examiner

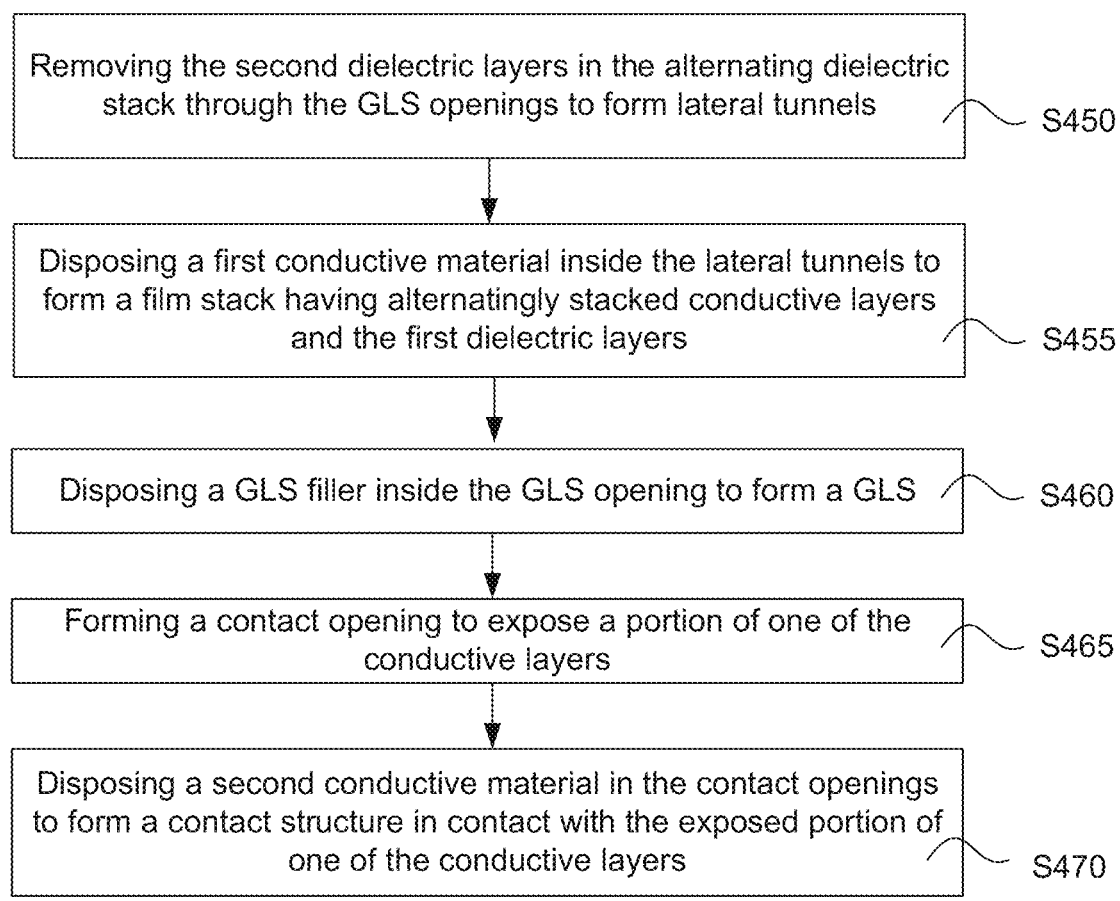
FIG. 4 (cont')

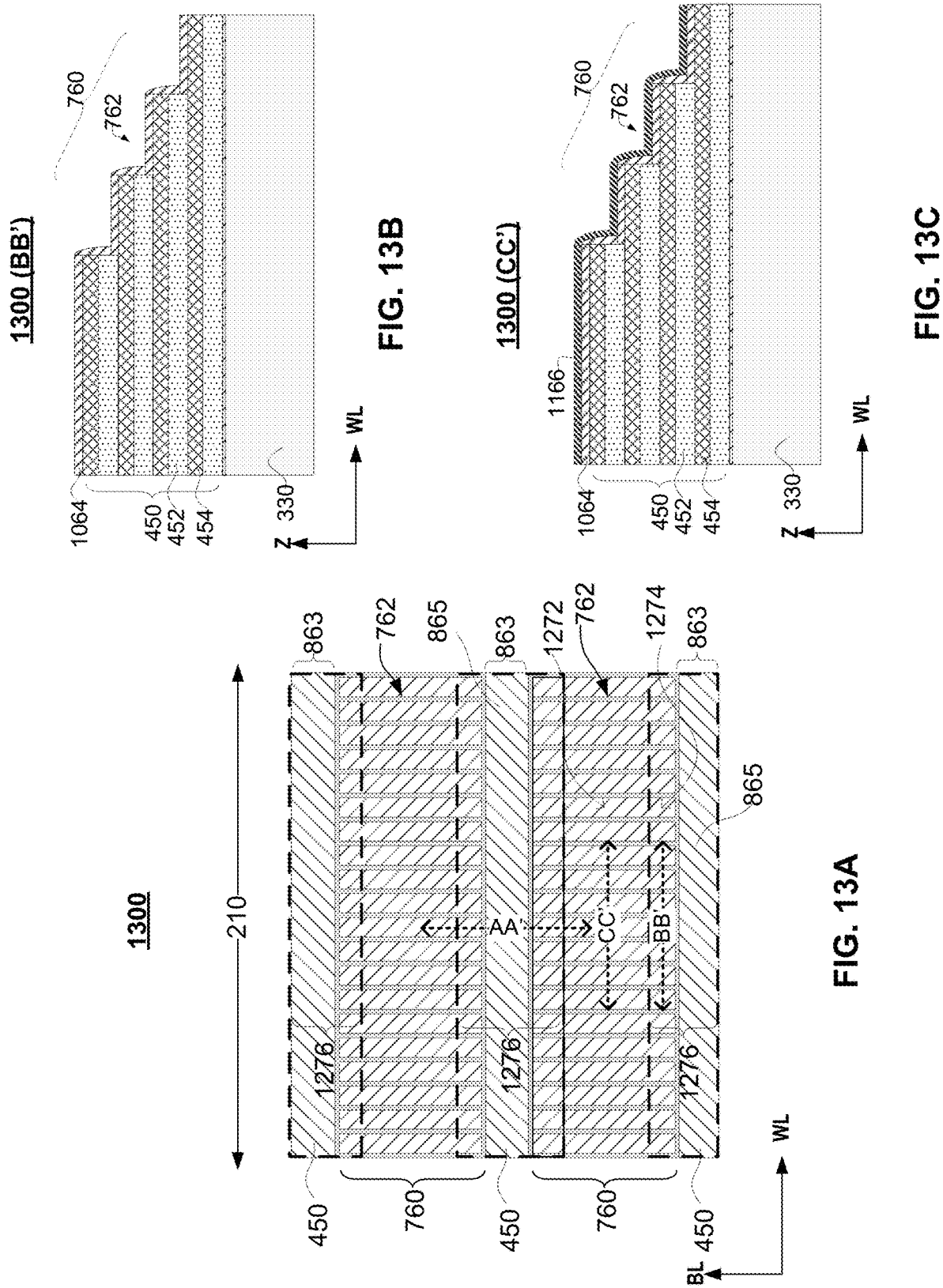

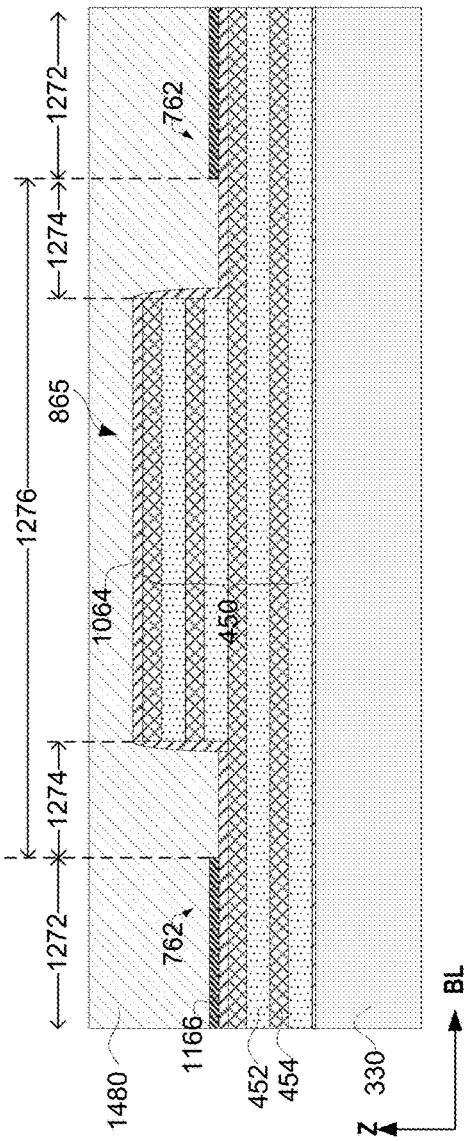
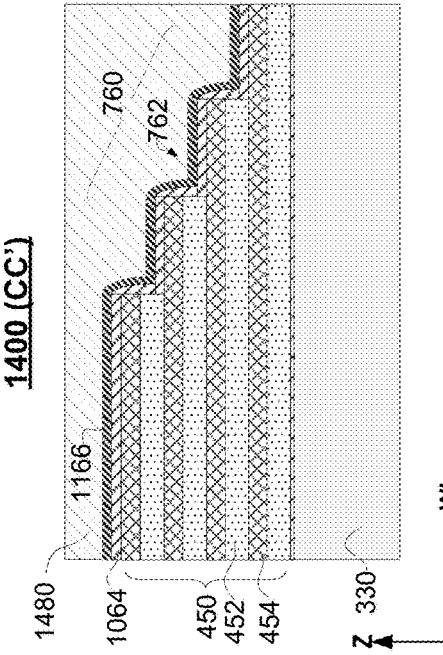
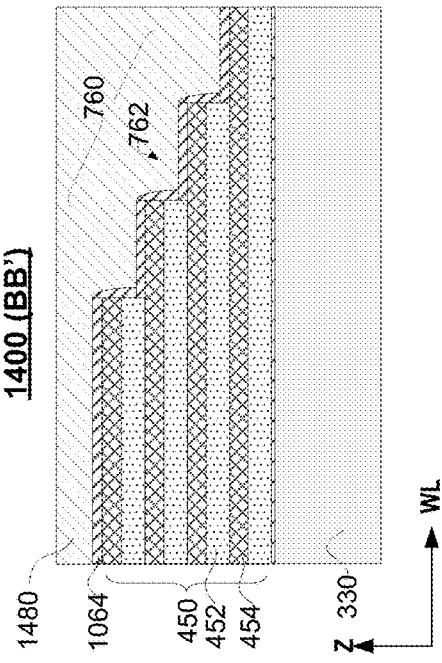
FIG. 14A
FIG. 14B
FIG. 14C

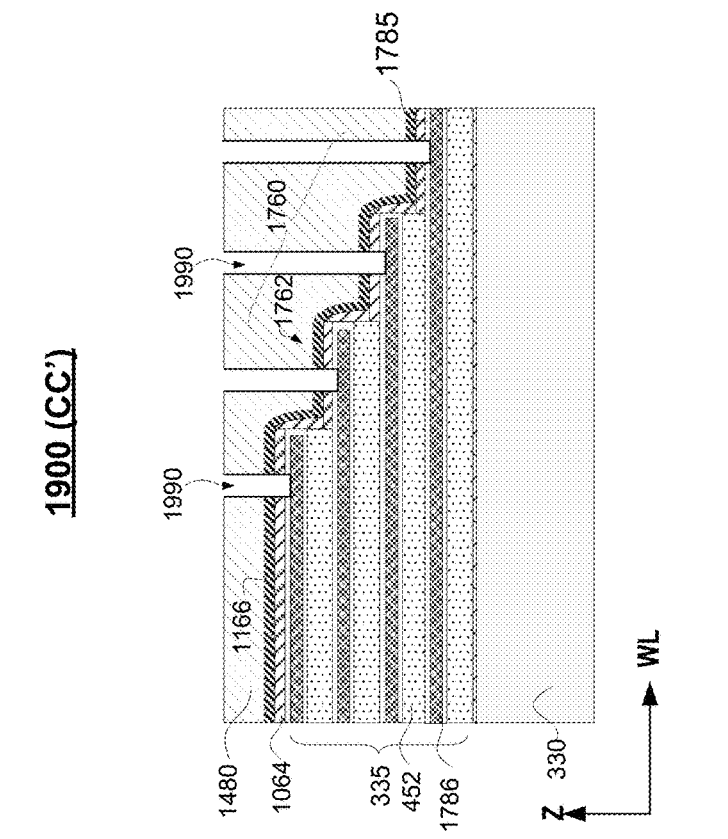
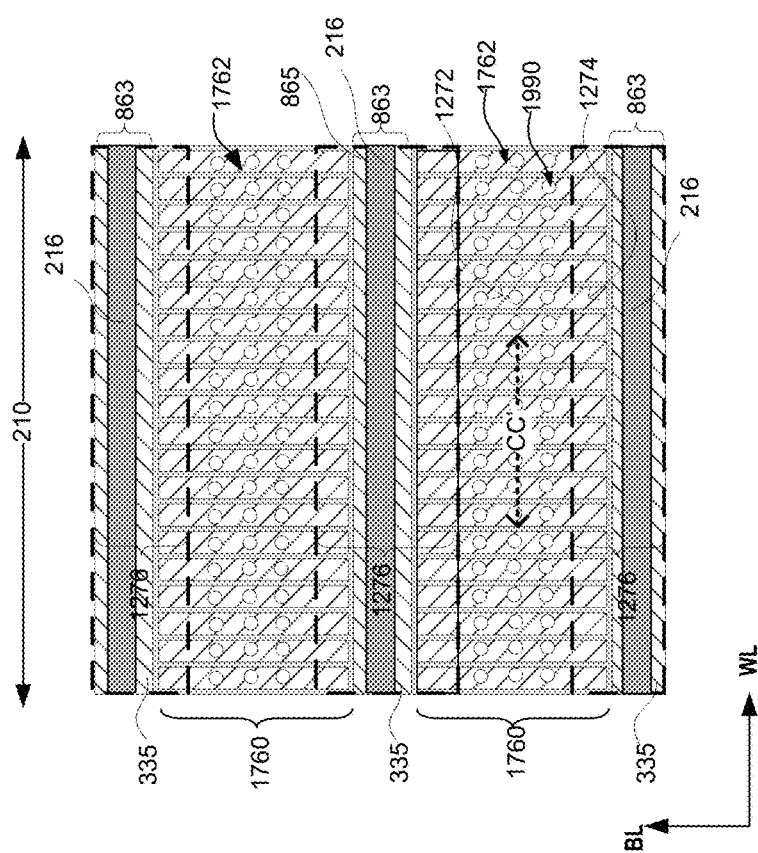
FIG. 19B
FIG. 19A

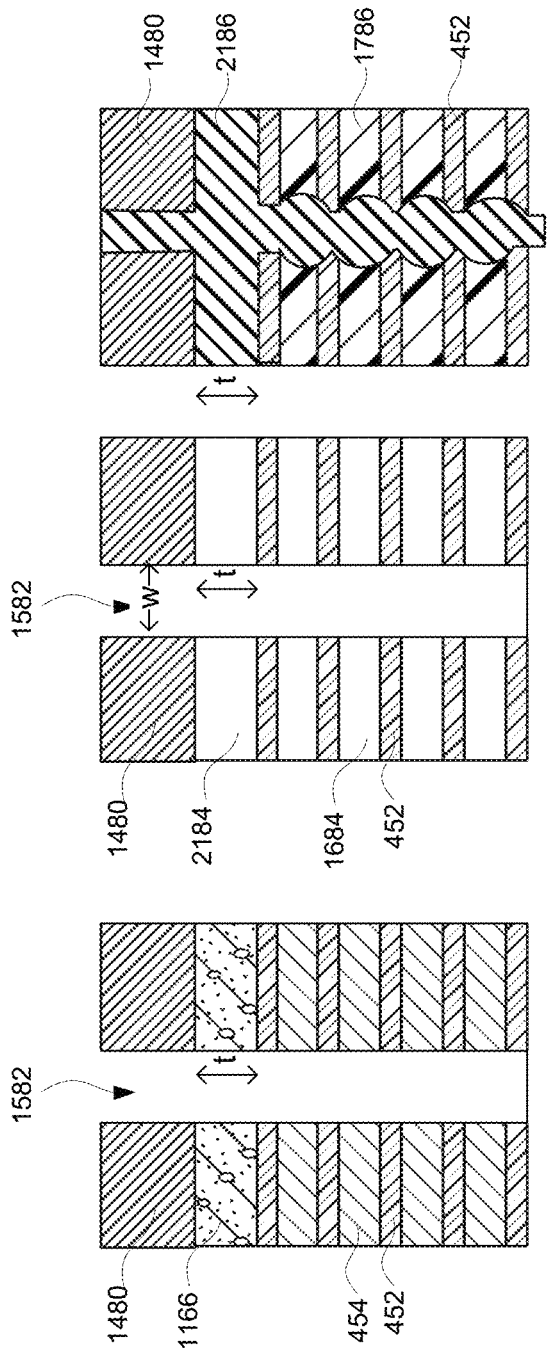

FIG. 24

BARRIER LAYERS FOR WORD LINE CONTACTS IN A THREE-DIMENSIONAL NAND MEMORY AND FABRICATION METHODS THEREOF

INCORPORATION BY REFERENCE

This application claims priority to International Patent Application No. PCT/CN2021/140362 filed on Dec. 22, 2021, which is incorporated herein by reference in its entirety.

TECHNICAL FIELD

The present disclosure generally relates to the field of semiconductor technology, and more particularly, to structures and fabrication methods for forming barrier layers to provide etch-stop for word line contacts in a three-dimensional NAND flash memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The vertically stacked memory cells can be addressed through word lines and bit lines, where each word line can control memory cells on one layer. To make electrical connections to the vertically stacked word lines, a staircase structure can be used to form contact structures for each word line.

To further increase the storage density of a 3D NAND flash memory, the number of vertically stacked word lines has been significantly increased. Accordingly, the contact structures for the word lines have a wide range of depths, with the shortest one for an uppermost word line and the longest one for a lowermost word line. To form contact structures for the word lines simultaneously, an etch-stop layer (e.g., silicon nitride) can be disposed on the staircase structure to avoid over-etching on upper word lines. However, the etch-stop layer can be lost during various processes prior to fabricating the contact structures. Additionally, the etch-stop layer can introduce other problems. For example, a thick etch-stop layer can cause seams at tungsten refill during word line formation. Therefore, a need exists to provide an improved method for forming a 3D NAND flash memory.

BRIEF SUMMARY

Embodiments of improved structures and fabrication methods for forming barrier layers to provide etch-stop for word line contacts in a three-dimensional (3D) memory device are described in the present disclosure.

One aspect of the present disclosure provides a method for forming a three-dimensional memory device. The method includes disposing an alternating dielectric stack on a substrate in a first direction perpendicular to the substrate; and forming a staircase structure and a dividing wall in the alternating dielectric stack. The staircase structure and the dividing wall extend in a second direction parallel to the substrate, and the dividing wall is adjacent to the staircase structure. The method also includes forming, sequentially on the staircase structure, a first barrier layer and a second barrier layer different from the first barrier layer. The method further includes forming a gate line slit (GLS) opening in the dividing wall. The GLS opening penetrates through the alternating dielectric stack in the first direction and is distant from the second barrier layer in a third direction that is parallel to the substrate and is perpendicular to the second direction.

In some embodiments, the forming the first barrier layer on the staircase structure further includes disposing the first barrier layer to cover at least sidewalls of staircase steps of the staircase structure.

In some embodiments, the forming the second barrier layer on the staircase structure includes disposing a dielectric material on the staircase structure and the dividing wall; and removing a first portion of the dielectric material disposed on the dividing wall.

In some embodiments, the method further includes removing a second portion of the dielectric material disposed in a second region of the staircase structure adjacent to the dividing wall to form the second barrier layer in a first region of the staircase structure, wherein the first region and second region extend in the second direction and the first region is in a center of the staircase structure.

In some embodiments, the method also includes disposing a block mask to expose the dividing wall and the second region of the staircase structure adjacent to the dividing wall.

In some embodiments, the method further includes disposing a GLS filler inside the GLS opening to form a GLS, wherein the GLS filler includes an insulating material.

In some embodiments, the method further includes removing the second dielectric layers from between the first dielectric layers through the GLS opening to form lateral tunnels; and disposing a first conductive material inside the lateral tunnels to form a film stack comprising alternatingly stacked conductive layers and the first dielectric layers.

In some embodiments, the removing the second dielectric layers includes etching the second dielectric layers selectively with respect to the first dielectric layers and the first barrier layer.

In some embodiments, the method further includes disposing an insulating layer on the second barrier layer over the staircase structure.

In some embodiments, the method further includes forming a contact structure to contact one of the conductive layers in the film stack, which includes forming a contact opening penetrating through the insulating layer in the first direction to expose a portion of the one of the conductive layers; and disposing a second conductive material inside the contact opening to contact the exposed portion of the one of the conductive layers.

In some embodiments, the forming the contact opening includes etching the insulating layer selectively with respect to the second barrier layer; and etching the second barrier layer and the first barrier layer to expose a portion of the one of the conductive layers inside the contact opening.

Another aspect of the present disclosure provides a three-dimensional (3D) memory device. The 3D memory devices includes a film stack having conductive layers and first dielectric layers alternatingly stacked on a substrate in a first direction perpendicular to the substrate. The 3D memory device also includes a staircase structure disposed in the film stack and extending in a second direction parallel to the substrate; and a dividing wall extending in the second direction and located adjacent to the staircase structure. The 3D memory device further includes a gate line slit (GLS)

disposed in the dividing wall, wherein the GLS penetrates through the film stack in the first direction and extends in the second direction. The 3D memory device also includes a first barrier layer disposed on the staircase structure; and a second barrier layer disposed on the first barrier layer in a first region of the staircase structure, wherein the second barrier layer, different from the first barrier layer, is distant from the GLS in a third direction parallel to the substrate and perpendicular to the second direction.

In some embodiments, the first barrier layer covers at least sidewalls of staircase steps of the staircase structure.

In some embodiments, the 3D memory device further includes an insulating layer disposed on the second barrier layer to cover a top surface and sidewalls of the second barrier layer.

In some embodiments, the 3D memory device also includes a contact structure, penetrating through the insulating layer, the second barrier layer and the first barrier layer in the first direction, wherein the contact structure is in contact with one of the conductive layers of the film stack.

In some embodiments, the first region is in a center of the staircase structure and extends in the second direction.

In some embodiments, the staircase structure further includes a second region, wherein the second region of the staircase structure extends in the second direction and is positioned between the dividing wall and the first region.

In some embodiments, the first barrier layer includes silicon oxide and the second barrier layer includes silicon nitride.

In some embodiments, the first barrier layer includes a thickness in a range between 10 nm to 100 nm.

In some embodiments, the second barrier layer includes a thickness in a range between 50 nm to 500 nm.

In some embodiments, the GLS includes an insulating material and is configured to divide a storage unit to sub-storage units that perform read or program operations independently.

Yet another aspect of the present disclosure provides a memory storage system, including a three-dimensional memory device and a memory controller. The 3D memory device includes the features described above. The memory controller is configured to control operations of the three-dimensional memory device and is connected with the 3D memory device Yet another aspect of the present disclosure provides a 3D memory die, including a three-dimensional memory device and a periphery circuit. The 3D memory device includes the features described above. The periphery circuit is coupled to the 3D memory device and is configured to support operations of the 3D memory device Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 13A-13D illustrate a top-down view and various cross-sectional views of an exemplary structure of the 3D memory device at a certain process step according to some embodiments of the present disclosure.

FIGS. 14A-14C illustrate various cross-sectional views of an exemplary structure of the 3D memory device at a certain process step according to some embodiments of the present disclosure.

FIGS. 19A-19B illustrate a top-down view and a cross-sectional view of an exemplary structure of the 3D memory device at a certain process step according to some embodiments of the present disclosure.

FIGS. 21A-21C illustrate cross-sectional views of another exemplary structure of the 3D memory device, according to some embodiments of the present disclosure.

FIG. 24 illustrates a schematic of a three-dimensional (3D) memory die, according to some embodiments of the present disclosure.

Figure 1:
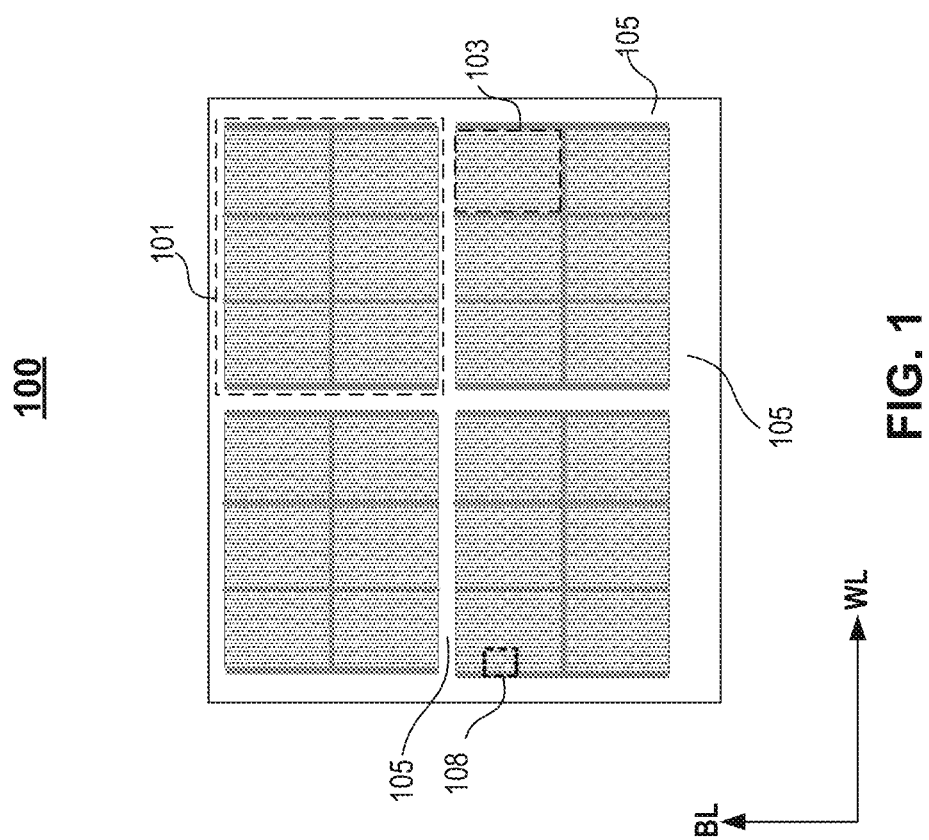
FIG. 1 illustrates a schematic top-down view of an exemplary three-dimensional (3D) memory device, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

Although the terms "first," "second," or the like, may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate. Similarly, the term "parallel" or "perpendicular" also means nominally parallel or perpendicular.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100, such as 3D NAND Flash memory, can be a memory chip (package), a memory die or any portion of a memory die, and can include one or more memory planes 101, each of which can include memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include memory cells, where each memory cell can be addressed through interconnections such as bit lines and word lines. The bit lines and word lines can be laid out perpendicularly (e.g., in rows and columns, respectively), forming an array of metal lines. Directions in which the bit lines and word lines extend are labeled as "BL" and "WL" in FIG. 1, and are also referred to a WL-direction and a BL-direction. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Periphery circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
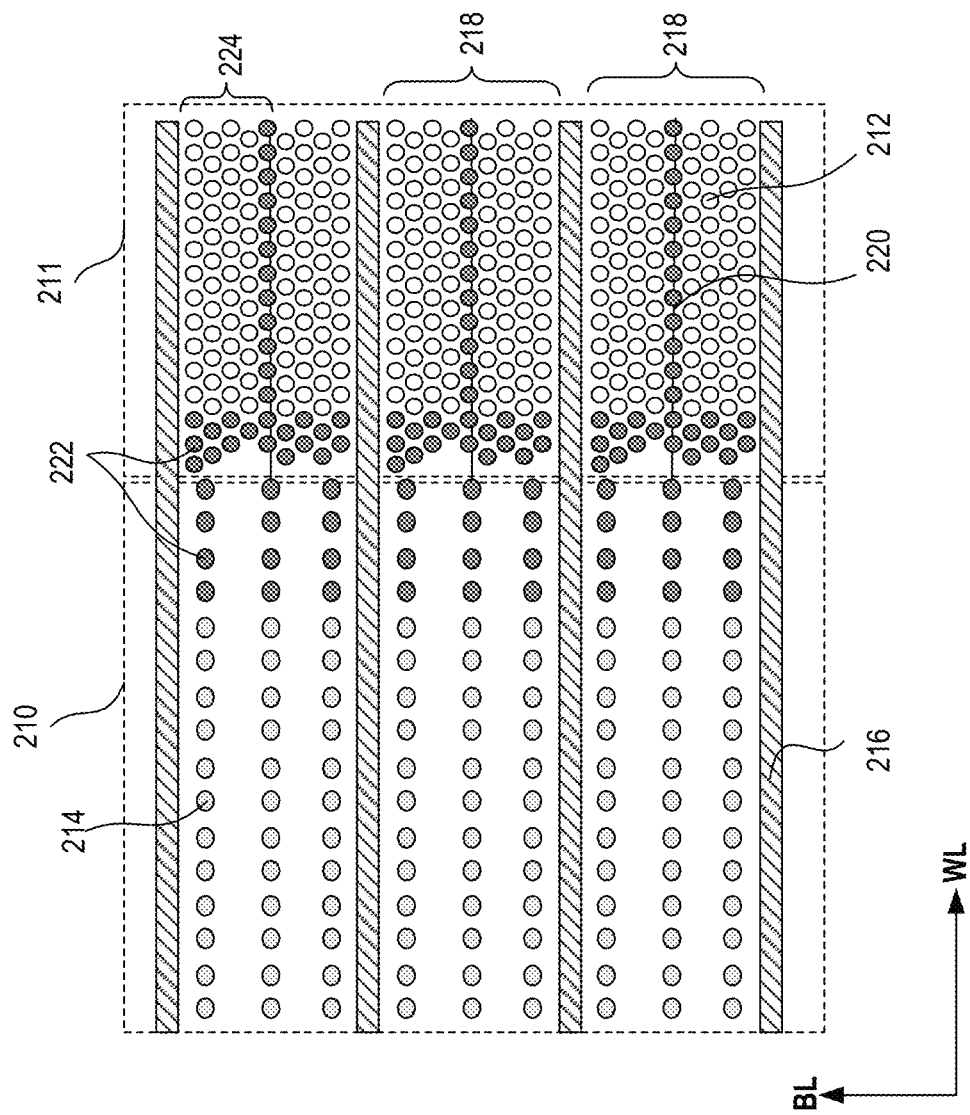
FIG. 2 illustrates a schematic top-down view of a region of 3D memory device, according to some embodiments of the present disclosure.

Referring to FIG. 2, an enlarged top-down view of a region 108 of the memory block 103 in FIG. 1 is illustrated, according to some embodiments of the present disclosure. The region 108 of the 3D memory device 100 can include a staircase region 210 and a channel structure region 211. The channel structure region 211 can include an array of memory strings 212, each including stacked memory cells. The staircase region 210 can include a staircase structure and an array of contact structures 214 formed on the staircase structure. In some embodiments, slit structures (also referred to as gate line slits) 216, extending in the WL-direction across the channel structure region 211 and the staircase region 210, can divide a memory block into multiple memory fingers 218. At least some slit structures 216 can function as the common source contact (e.g., to an array common source) for an array of memory strings 212 in the channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, the region 108 also includes dummy memory strings 222 for process variation control during fabrication and/or for additional mechanical support.

Figure 3:
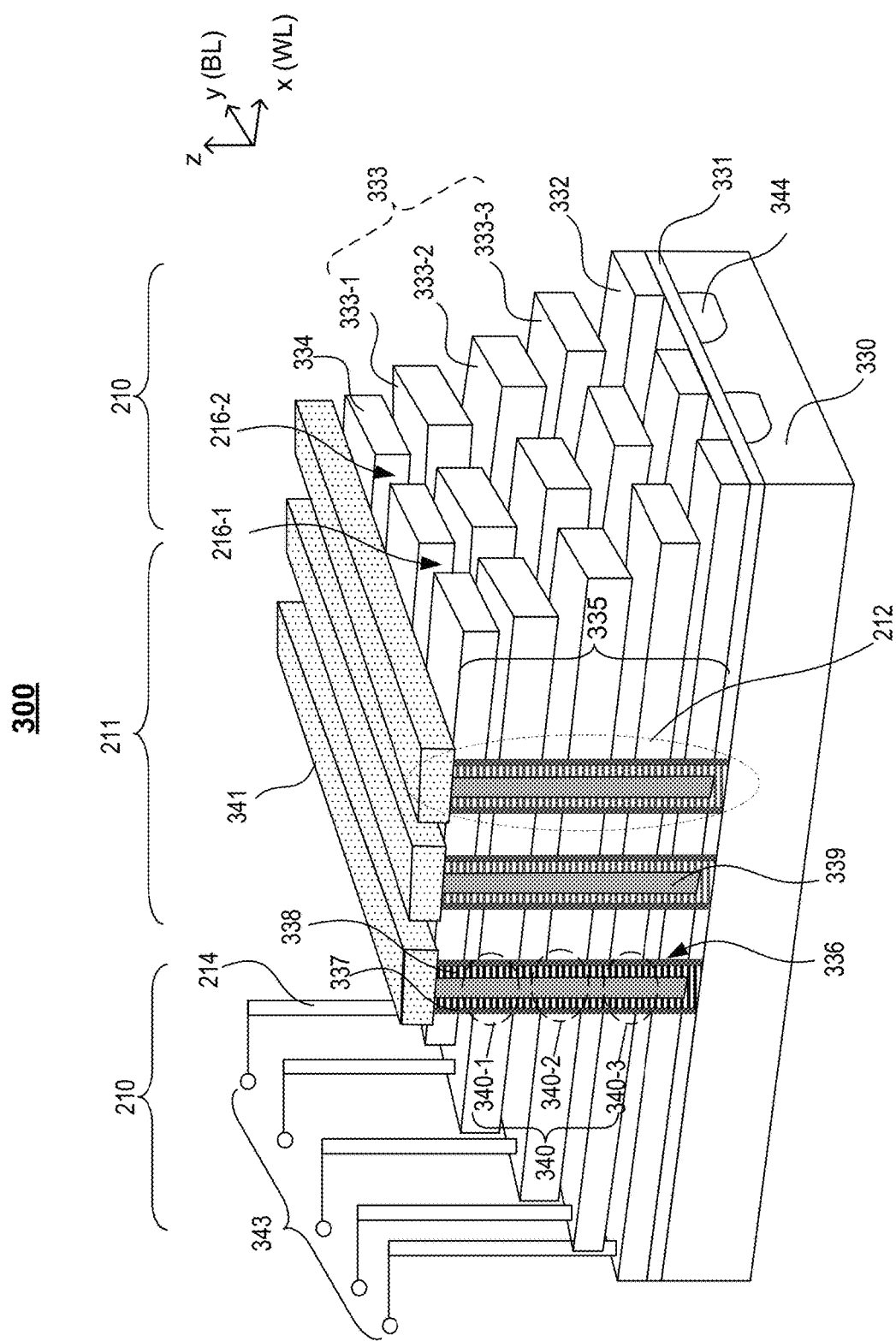
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of bottom select gates (BSGs) 332 over the insulating film 331, and tiers of control gates 333, also referred to as word lines (WLs), stacking on top of the BSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 formed over the stack of control gates 333. The stack of TSG 334, control gates 333 and BSG 332 is also referred to as "gate electrodes". The memory array structure 300 further includes the memory strings 212 and doped source line regions 344 in portions of substrate 330 between adjacent BSGs 332. Each memory strings 212 includes a channel hole 336 extending through the insulating film 331 and the film stack 335 of alternating conductive and dielectric layers. The memory strings 212 also includes a memory film 337 disposed on a sidewall of the channel hole 336, a channel layer 338 disposed on a sidewall of the memory film 337, and a core filler 339 surrounded by the channel layer 338. A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel 338 of the memory cell. The memory array structure 300 further includes bit lines (BLs) 341 connected with the memory strings 212, wherein the BLs 341 is positioned over the TSGs 334. The memory array structure 300 also includes metal interconnect lines 343 connected with the gate electrodes through contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of BSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact (i.e., array common source) and dummy memory string. These structures are not shown in FIG. 3 for simplicity.

To further increase the storage density of a 3D NAND memory, the number of vertically stacked word lines 333 has been increased continuously. Accordingly, the contact structures 214 for the word lines 333 have a wide range of depths, with the shortest one for an uppermost word line and the longest one for a lowermost word line. To form contact structures 214 for all the word lines 333 simultaneously, an etch-stop layer can be disposed on the staircase structure to avoid over-etching on upper word lines. However, the etch-stop layer can be lost during various processes prior to fabricating the contact structures. For example, as shown in FIG. 21A, an etch-stop layer (also referred to as a second barrier layer 1166 in the detailed description below) for forming the contact structures 214 and sacrificial layers (also referred to as second dielectric layers 454 in the detailed description below) used for forming the word lines 333 are usually made of the same material, e.g., silicon nitride. During a replacement process for forming the word lines 333, the etch-stop layer 1166 can be removed simultaneously as the sacrificial layers 454 through a gate line slit (GLS) opening 1582. Lateral tunnels 1684 and 2184 can be formed as shown in FIG. 21B. An additional conductive layer 2186 can be formed simultaneously as conductive layers 1786 that can function as word lines 333. As such, parasitic leakage path can occur due to the additional conductive layer 2186. Additionally, a thick etch-stop layer 1166 can cause seams in the additional conductive layer 2186, which can weaken the mechanical strength of the 3D memory structure. Therefore, a need exists to provide an improved method for forming a 3D NAND memory.

Figure 4:
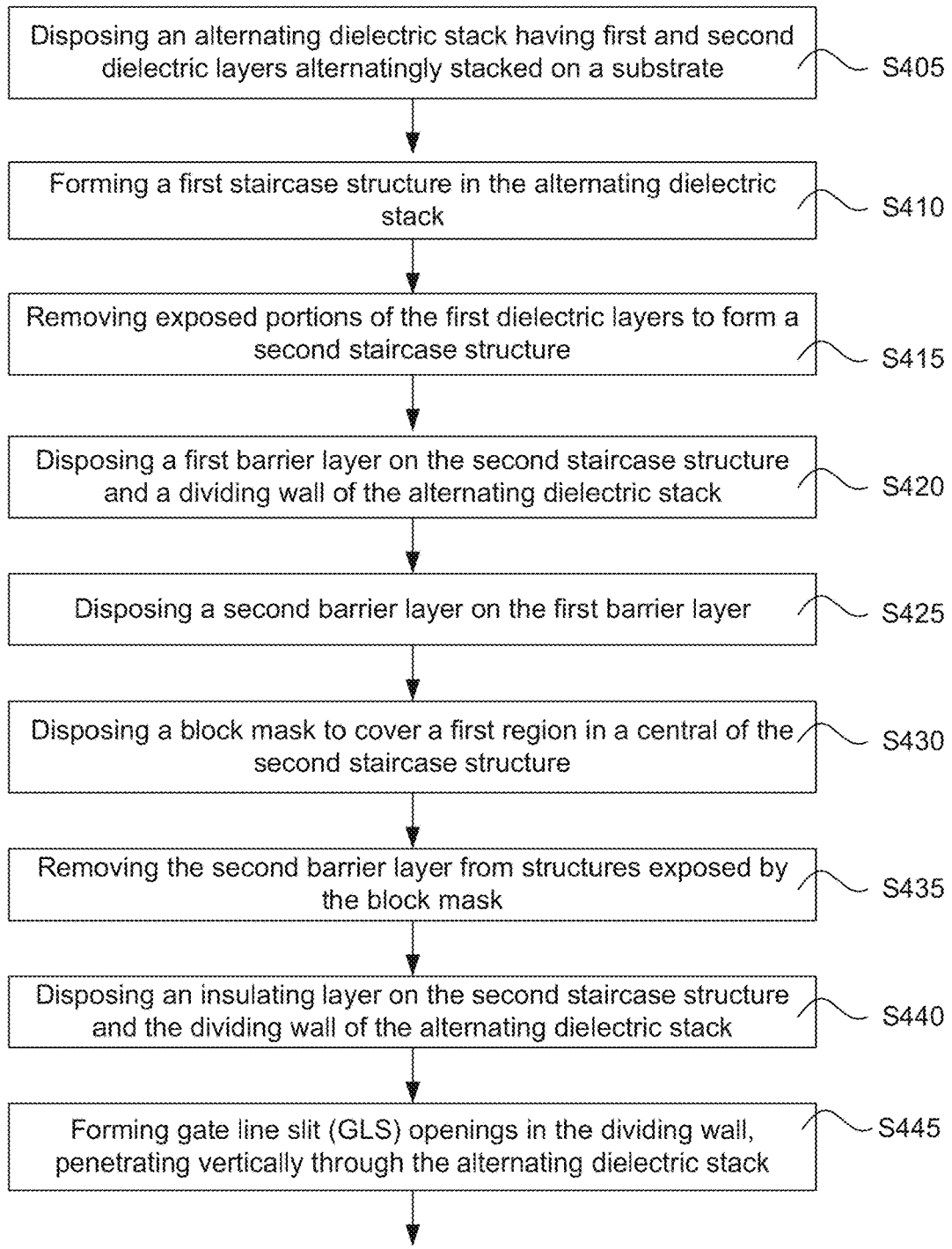
FIG. 4 illustrates a process flow for fabricating a 3D memory device, according to some embodiments of the present disclosure.

FIG. 4 illustrates a method 400 for forming a three-dimensional (3D) memory device, according to some embodiments of the present disclosure. It should be understood that process steps shown in method 400 are not exhaustive and that other steps can be performed as well before, after, or between any of the illustrated steps. In some embodiments, some steps of method 400 can be omitted, or other steps can also be included, which are not described here for simplicity. In some embodiments, steps of method 400 can be performed in a different order and/or vary.

FIGS. 5-12, 13A-13D, 14A-14C, 15A-15B, 16A-16C, 17A-17C, 18A-18B, 19A-19B, 20A-20D illustrate exemplary structures of the 3D memory device at certain process step according to the method 400.

Referring to FIG. 4, at process step S405, an alternating dielectric stack can be disposed on a substrate, where the alternating dielectric stack includes first dielectric layers and second dielectric layers alternatingly stacked on a substrate. A cross-sectional view of an exemplary 3D memory structure 500 is shown in FIG. 5, according to the process step S405.

Figure 5:
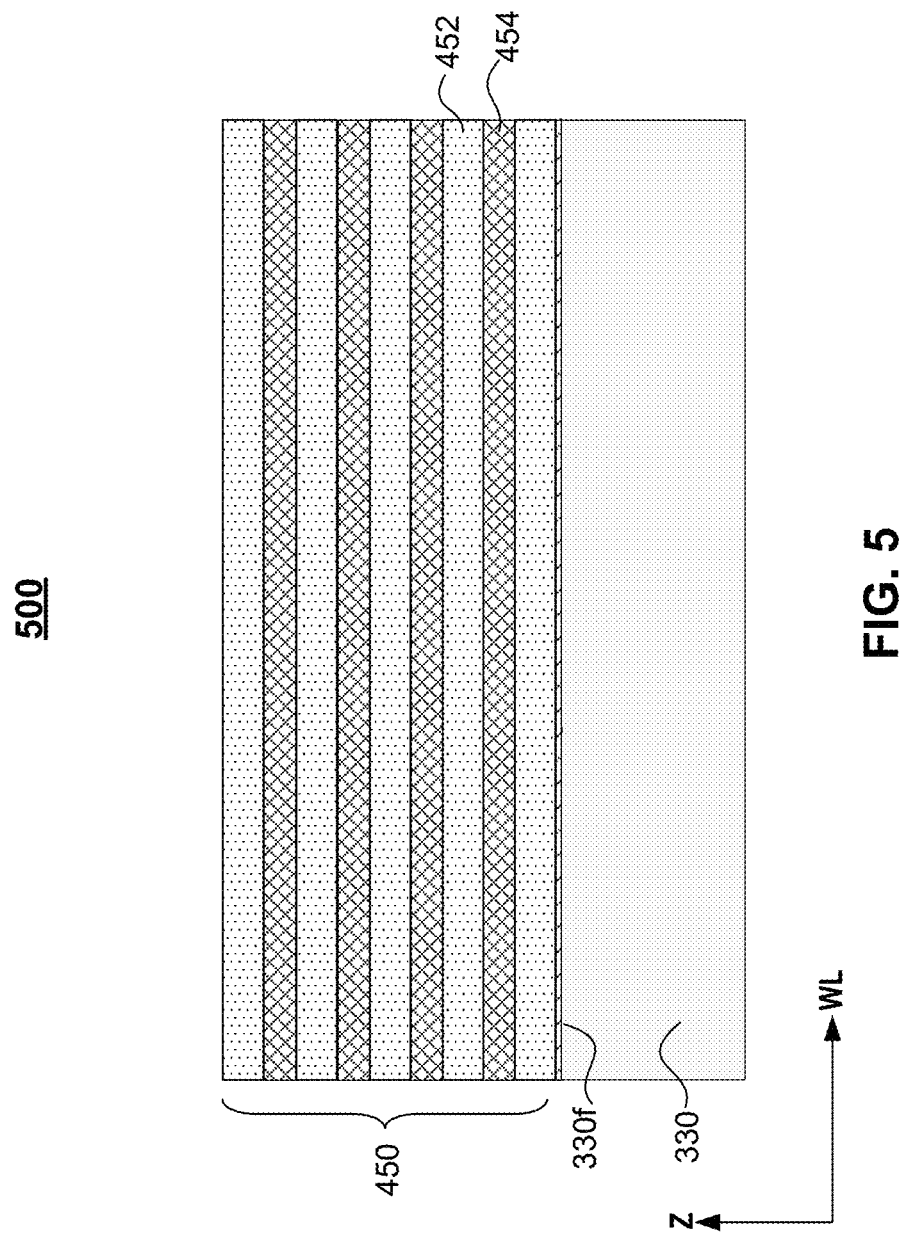
FIG. 5 illustrates a cross-sectional view of an exemplary structure of the 3D memory device at a certain process step, according to some embodiments of the present disclosure.

As shown in FIG. 5, the 3D memory structure 500 includes an alternating dielectric stack 450 disposed on the substrate 330.

The substrate 330 can provide a platform for forming subsequent structures. In some embodiments, the substrate 330 can be any suitable semiconductor substrate having any suitable semiconductor materials, such as monocrystalline, polycrystalline or single crystalline semiconductors. For example, the substrate 330 can include silicon, silicon germanium (SiGe), germanium (Ge), silicon on insulator (SOI), germanium on insulator (GOI), gallium arsenide (GaAs), gallium nitride, silicon carbide, III-V compound, or any combinations thereof. In some embodiments, the substrate 330 can include a layer of semiconductor material formed on a handle wafer, for example, glass, plastic, or another semiconductor substrate.

A front surface 330$f$ of the substrate 330 is also referred to as a "main surface" or a "top surface" of the substrate herein. Layers of materials can be disposed on the front surface 330$f$ of the substrate 330. A "topmost" or "upper" layer is a layer farthest or farther away from the front surface 330$f$ of the substrate. A "bottommost" or "lower" layer is a layer closest or closer to the front surface 330$f$ of the substrate.

The alternating dielectric stack 450 includes dielectric layer pairs alternatingly stacked along a vertical direction (i.e., a z-direction or a first direction) perpendicular to the front surface 330$f$ of the substrate 330, where each dielectric layer pair includes a first dielectric layer 452 (also referred to as "dielectric layer") and a second dielectric layer 454 (also referred to as "sacrificial layer") that is different from the first dielectric layer 452. The alternating dielectric stack 450 extends in a lateral direction (e.g., the WL-direction or a second direction) that is parallel to the front surface 330$f$ of the substrate 330.

In the alternating dielectric stack 450, first dielectric layers 452 and second dielectric layers 454 alternate in the vertical direction perpendicular to the substrate 330. In the other words, each second dielectric layer 454 can be sandwiched between two first dielectric layers 452, and each first dielectric layer 452 can be sandwiched between two second dielectric layers 454 (except the bottommost and the topmost layer).

The formation of the alternating dielectric stack 450 can include disposing the first dielectric layers 452 to each have the same thickness or to have different thicknesses. Example thicknesses of the first dielectric layers 452 can range from 10 nm to 500 nm, preferably about 25 nm. Similarly, the second dielectric layer 454 can each have the same thickness or have different thicknesses. Example thicknesses of the second dielectric layer 454 can range from 10 nm to 500 nm, preferably about 35 nm. It should be understood that the number of dielectric layer pairs in FIG. 5 is for illustrative purposes only and that any suitable number of layers may be included in the alternating dielectric stack 450.

In some embodiments, the first dielectric layer 452 includes any suitable insulating materials, for example, silicon oxide, silicon oxynitride, silicon nitride, TEOS or silicon oxide with F—, C—, N—, and/or H— incorporation. The first dielectric layer 452 can also include high-k dielectric materials, for example, hafnium oxide, zirconium oxide, aluminum oxide, tantalum oxide, or lanthanum oxide films. In some embodiments, the first dielectric layer 452 can be any combination of the above materials.

The formation of the first dielectric layer 452 on the substrate 330 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), sputtering, evaporation, thermal oxidation, nitridation, any other suitable deposition method, and/or combinations thereof.

In some embodiments, the second dielectric layer 454 includes any suitable material that is different from the first dielectric layer 452 and can be removed selectively with respect to the first dielectric layer 452. For example, the second dielectric layer 454 can include silicon oxide, silicon oxynitride, silicon nitride, TEOS, poly-crystalline silicon, poly-crystalline germanium, poly-crystalline germanium-silicon, and any combinations thereof. In some embodiments, the second dielectric layer 454 also includes amorphous semiconductor materials, such as amorphous silicon or amorphous germanium. The second dielectric layer 454 can be disposed using a similar technique as the first dielectric layer 452, such as CVD, PVD, ALD, sputtering, evaporation, thermal oxidation or nitridation, or any combination thereof.

In some embodiments, the first dielectric layer 452 can be silicon oxide and the second dielectric layer 454 can be silicon nitride.

In some embodiments, the alternating dielectric stack 450 can include layers in addition to the first dielectric layer 452 and the second dielectric layer 454, and can be made of different materials and/or with different thicknesses.

Referring to FIG. 4, at process step S410, a first staircase structure can be formed in the alternating dielectric stack. A cross-sectional view of an exemplary 3D memory structure 600 is shown in FIG. 6, according to the process step S410.

Figure 6:
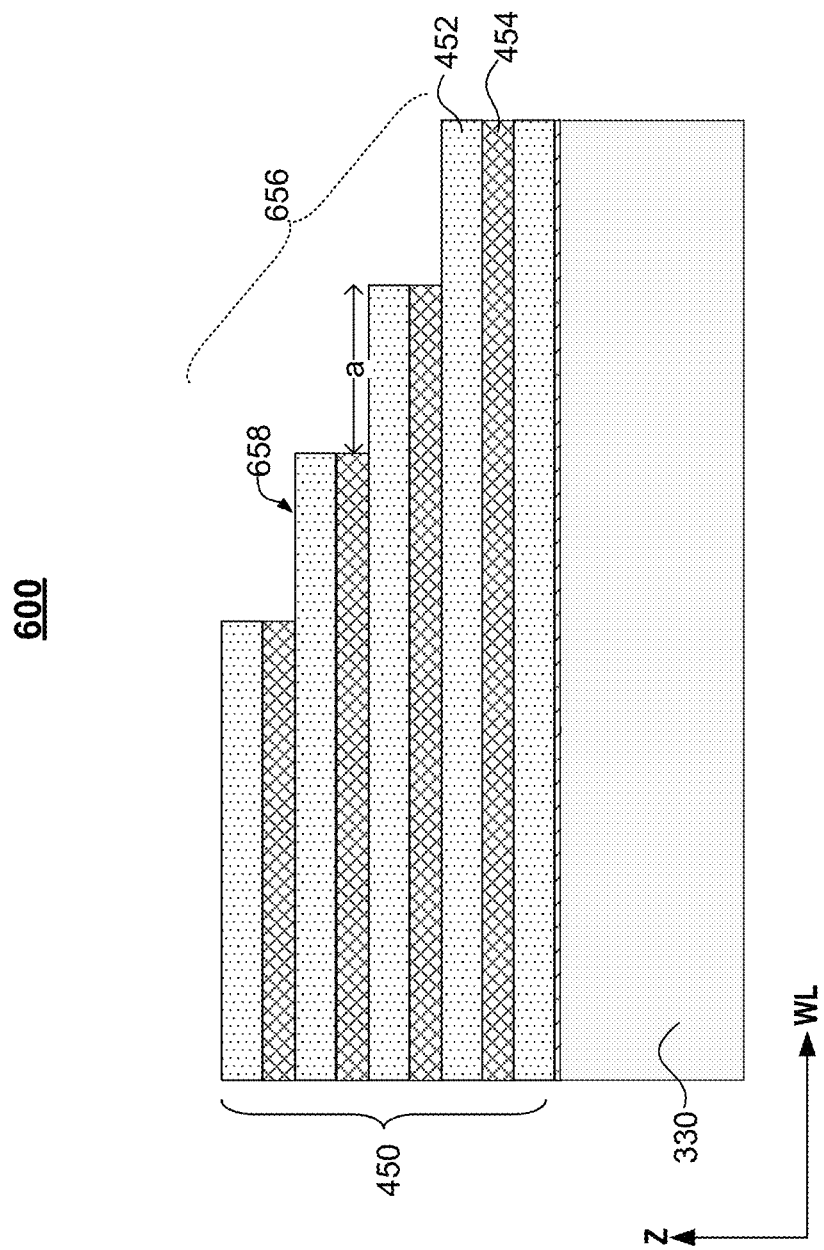
FIG. 6 illustrates a cross-sectional view of an exemplary structure of the 3D memory device at a certain process step, according to some embodiments of the present disclosure.

As shown in FIG. 6, the 3D memory structure 600 includes a first staircase structure 656 with first staircase steps 658 formed in the alternating dielectric stack 450. The first staircase step 658, or a "staircase layer", refers to a layer stack with the same lateral dimension in a surface parallel to the substrate surface 330f. Each of the first staircase steps terminates at a shorter length than the first staircase step underneath, with a lateral dimension "a" shown in FIG. 6. In some embodiments, the first staircase structure 656 has the first staircase steps 658 facing the WL-direction, where each of the first staircase steps 658 includes the lateral dimension "a" along the WL-direction. In this example, the first staircase structure 656 extends in the WL-direction (or the second direction) parallel to the substrate.

In some embodiments, each of the first staircase steps 658 includes one pair of the first dielectric layer 452 and the second dielectric layer 454. In some embodiments, each of the first staircase steps 658 can include two or more pairs of the first dielectric layer 452 and the second dielectric layer 454. As shown in FIG. 6, each of the first staircase steps 658 includes one pair of the first dielectric layer 452 and the second dielectric layer 454, where the first dielectric layer 452 is on top of the second dielectric layer 454. Each of the first staircase steps 658 exposes a portion of the first dielectric layer 452.

The first staircase structure 656 can be formed by applying a repetitive etch-trim process on the alternating dielectric stack 450. The etch-trim process includes an etching process and a trimming process. During the etching process, a portion of the first staircase step 658 with exposed surface can be removed. The remaining portion of the first staircase step 658, either covered by upper levels of staircase steps or covered by a patterning mask, is not etched. The etch depth is a thickness of the first staircase step 658. In some embodiments, the thickness of the first staircase step 658 is a thickness of one pair of the first dielectric layer 452 and the second dielectric layer 454. The etching process for the first dielectric layer 452 can have a high selectivity over the second dielectric layer 454, and/or vice versa. Accordingly, an underlying dielectric layer pair can function as an etch-stop layer. By switching etching process for each layer, the first staircase step 658 can be etched during one etching cycle. And as a result, one of the first staircase steps 658 can be formed during each etch-trim cycle.

In some embodiments, the first staircase step 658 can be etched using an anisotropic etching such as a reactive ion etch (RIE) or other dry etch processes. In some embodiments, the first dielectric layer 452 is silicon oxide. In this example, the etching of silicon oxide can include RIE using fluorine based gases, for example, carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed etching approach can be used. In some embodiments, the second dielectric layer 454 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer stack should not be limited by the embodiments of the present disclosure.

The trimming process includes applying a suitable etching process (e.g., an isotropic dry etch or a wet etch) on the patterning mask such that the patterning mask can be pulled back laterally. The lateral pull-back dimension determines the lateral dimension "a" of each step of the first staircase structure 656. After trimming the patterning mask, one portion of a topmost first staircase step 658 is exposed and the other portion of the topmost first staircase step 658 remains covered by the patterning mask. The next cycle of etch-trim process resumes with the etching process. In some embodiments, the patterning mask trimming process can include dry etching, such as RIE using $O_2$, Ar, $N_2$, etc.

Figure 8:
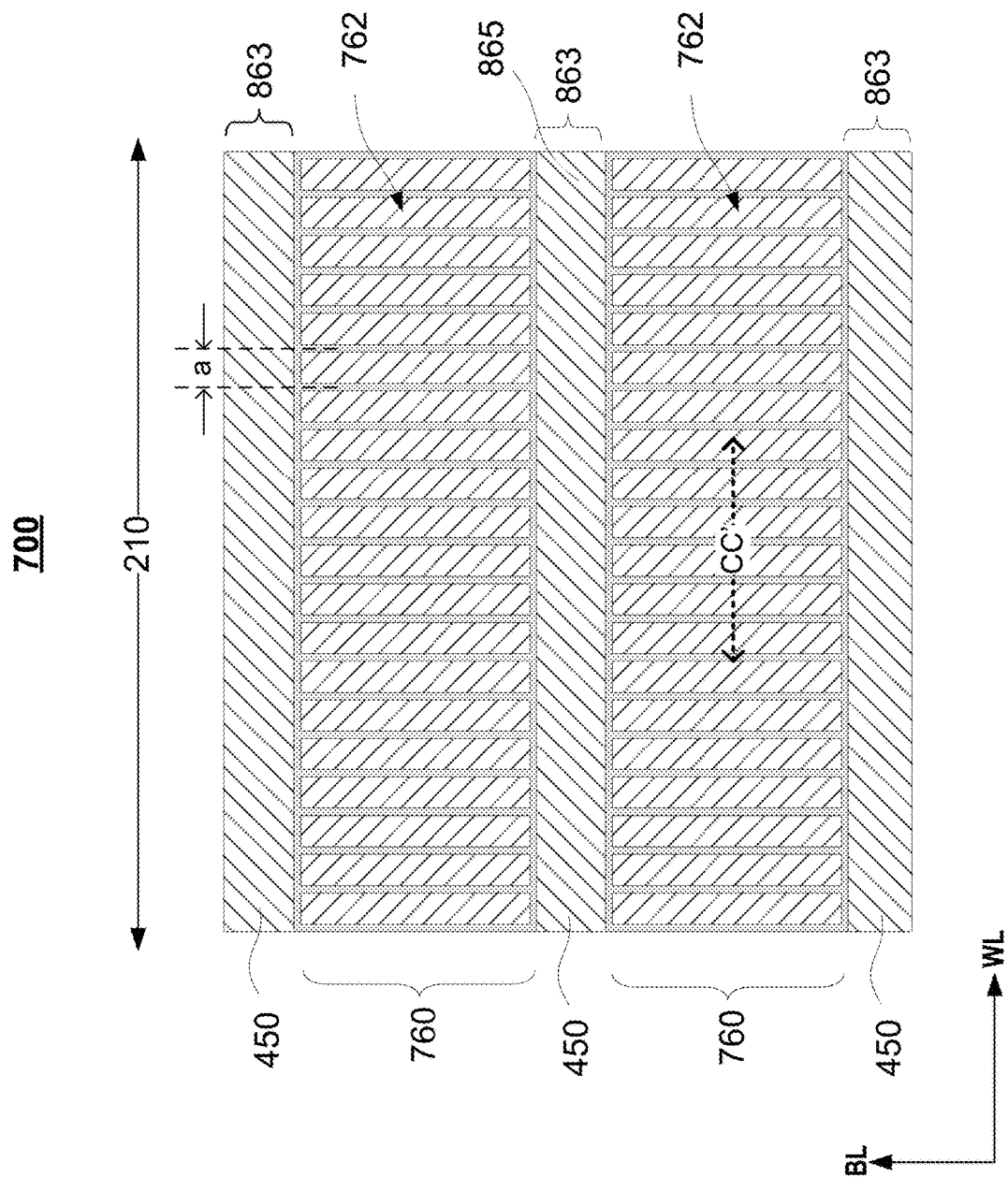
Figure 9:
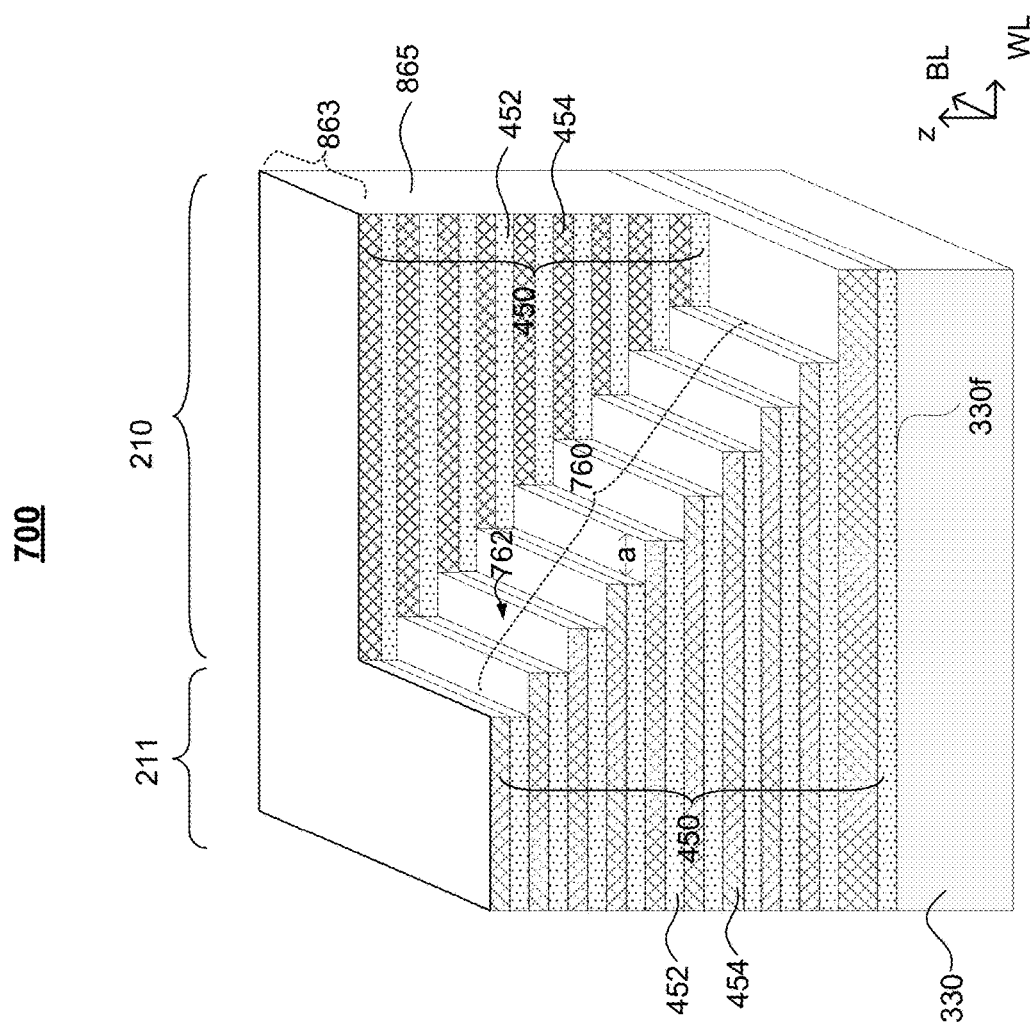

Referring to FIG. 4, at process step S415, a second staircase structure can be formed by removing exposed portions of the first dielectric layer 452. A cross-sectional view, a top down view and a perspective view of an exemplary 3D memory structure 700 are shown in FIGS. 7-9, respectively, according to the process step S415.

Figure 7:
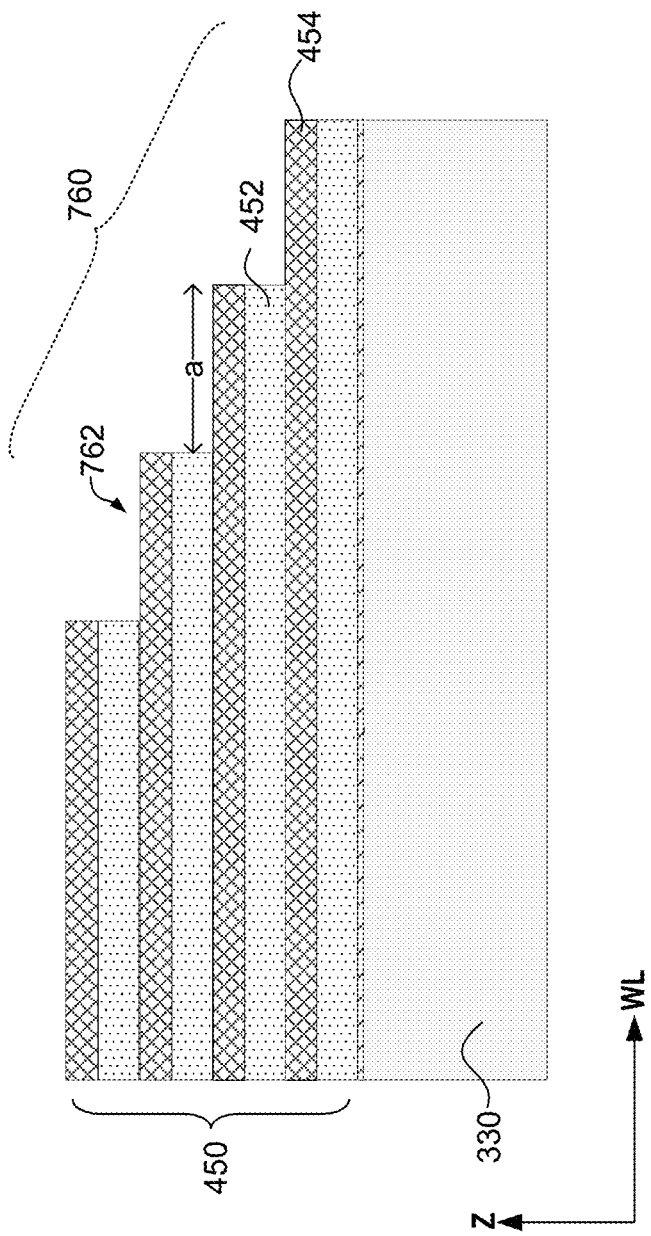
FIGS. 7-9 illustrate, respectively, a cross-sectional view, a top-down view and a perspective view of an exemplary structure of the 3D memory device at a certain process step, according to some embodiments of the present disclosure.

As shown in FIG. 7, the 3D memory structure 700 includes a second staircase structure 760 (also referred to as staircase structure) with second staircase steps 762 (also referred to as staircase steps) formed in the alternating dielectric stack 450. The second staircase structure 760 can be formed by removing exposed portions of the first dielectric layer 452 in the 3D memory structure 600 (in FIG. 6). Similar to the first staircase structure 656, the second staircase steps 762 also face the WL-direction, where the second staircase steps 762 have the lateral dimension "a" in the WL-direction. In this example, the second staircase structure 760 extends in the WL-direction (or the second direction) parallel to the substrate.

The first dielectric layer 452 can be etched using an anisotropic etching such as a reactive ion etch (RIE) or other dry etch processes. In some embodiments, the first dielectric layer 452 is silicon oxide. In this example, the etching of silicon oxide can include RIE using fluorine based gases, for example, carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed etching approach can be used. The etching process for the first dielectric layer 452 can have a high selectivity over the second dielectric layer 454. Accordingly, the second dielectric layer 454 can function as an etch-stop layer.

In some embodiments, each of the second staircase steps 762 also includes one pair of the first dielectric layer 452 and the second dielectric layer 454, where the second dielectric layer 454 is on top of the first dielectric layer 452. Each of the second staircase steps 762 exposes a portion of the second dielectric layer 454. In some embodiments, each of the second staircase steps 762 can also include two or more pairs of the first dielectric layer 452 and the second dielectric layer 454.

FIG. 7 illustrates a cross-sectional view along a line CC' in FIG. 8. As shown in FIGS. 8 and 9, the staircase region 210 extends along the WL-direction and can include one or more of the second staircase structures 760 extending along the WL-direction. Each of the second staircase structures 760 includes the second staircase steps 762, stepping up or down along the WL-direction with the lateral dimension "a." As an example, FIG. 8 depicts two second staircase structures 760, while FIG. 9 depicts more dielectric layer pairs of the first dielectric layer 452 and the second dielectric layer 454. It is noted that the number of staircase structures and the number of dielectric layer pairs in the 3D memory structure 700 are not limited to the examples herein.

As shown in FIGS. 8 and 9, the 3D memory structure 700 also includes multiple dividing regions 863, separating the second staircase structures 760. A portion of the alternating dielectric stack 450 in the dividing region 863 has not been etched during the repetitive etch-trim process for forming the first staircase structure 656 (in FIG. 6), which forms a dividing wall 865. The dividing region 863 is located adjacent to the second staircase structures 760. As such, the dividing wall 865 formed in the alternating dielectric stack 450 is positioned adjacent to the second staircase structure 760, and, just like the second staircase structure 760, extend in the WL-direction.

Referring to FIG. 4, at process step S420, a first barrier layer can be disposed on the second staircase structure and the dividing wall of the alternating dielectric stack. A cross-sectional view of an exemplary 3D memory structure 1000 is shown in FIG. 10, according to the process step S420.

Figure 10:
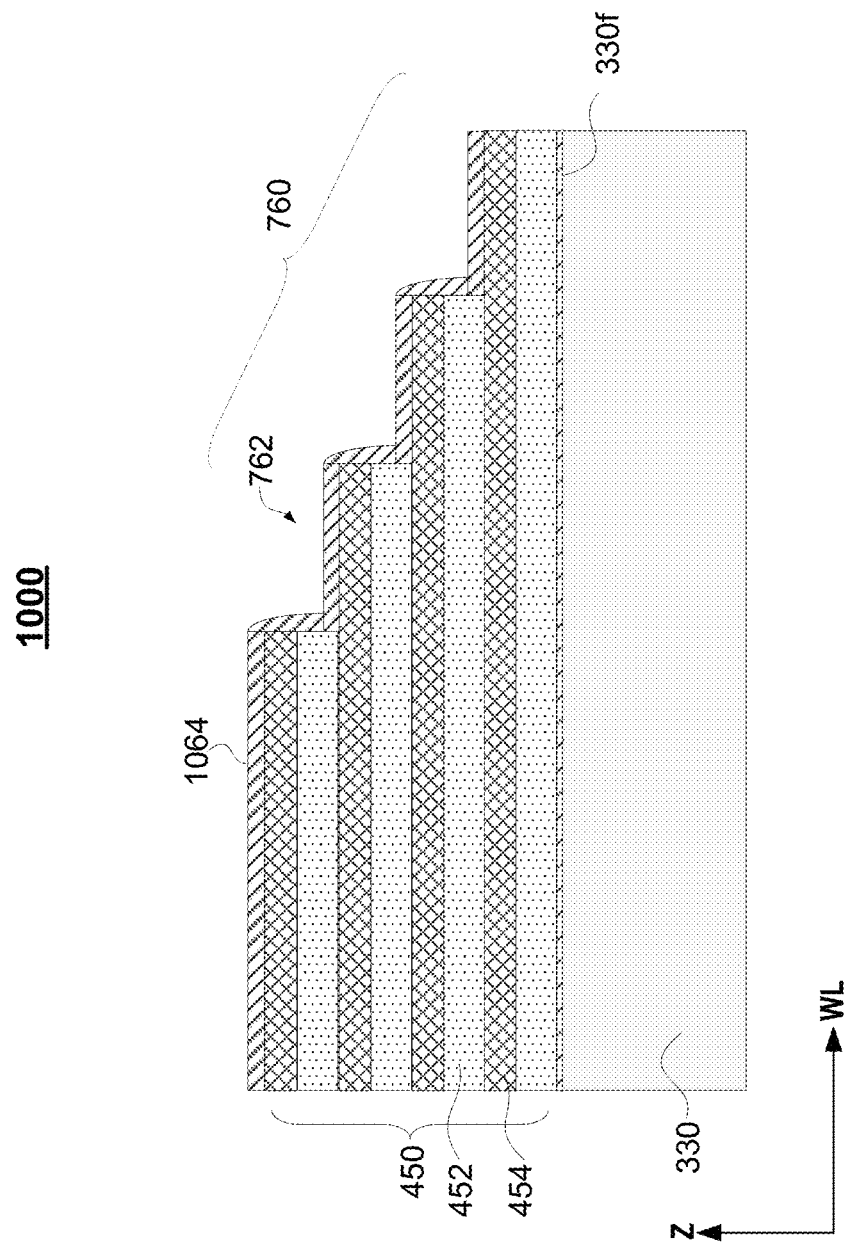
FIG. 10 illustrates a cross-sectional view of an exemplary structure of the 3D memory device at a certain process step, according to some embodiments of the present disclosure.

As shown in FIG. 10, the 3D memory structure 1000 includes a first barrier layer 1064 disposed on the 3D memory structure 700 (in FIGS. 7-9). The first barrier layer 1064 covers the second staircase structure 760 and the dividing wall 865 of the alternating dielectric stack 450 (as shown in FIGS. 8-9) on both lateral surfaces and vertical sidewalls. The first barrier layer 1064 on lateral surfaces and vertical sidewalls can have the same or different thicknesses. In some embodiments, the first barrier layer 1064 can be conformal, where thicknesses of the first barrier layer 1064 on lateral surfaces and vertical sidewalls are about the same. The first barrier layer 1064 can include a thickness in a range between 10 nm to 100 nm. The portion of the first barrier layer 1064 formed on the lateral surface of the staircase structure can function as an etch-stop layer for an etching process in the z-direction (the first direction) perpendicular to the substrate 330. The portion of the first barrier layer 1064 formed on the sidewalls of the staircase structure 760 can function as an etch-stop layer for an etching process in, for example, the WL-direction (or the second direction) parallel to the front surface 330f of the substrate 330.

In some embodiments, the first barrier layer 1064 can be any suitable insulating material, for example, silicon oxide, silicon nitride, silicon oxynitride, TEOS, high-k dielectric material ($Al_2O_3$, $HfO_2$, $Ta_2O_3$, $ZrO_2$, $La_2O_3$, etc.), or any combination thereof. The first barrier layer 1064 can be disposed by any suitable thin film deposition techniques such as CVD (e.g., PECVD, LPCVD, RTCVD, HDP-CVD, MOCVD, etc.), ALD, PVD, sputtering, evaporation, etc. In some embodiments, the first barrier layer 1064 can be silicon oxide.

Referring to FIG. 4, at process step S425, a second barrier layer, which is different from the first barrier layer, can be disposed on the first barrier layer over the second staircase structure and the dividing wall of alternating dielectric stack. A cross-sectional view of an exemplary 3D memory structure 1100 is shown in FIG. 11, according to the process step S425.

Figure 11:
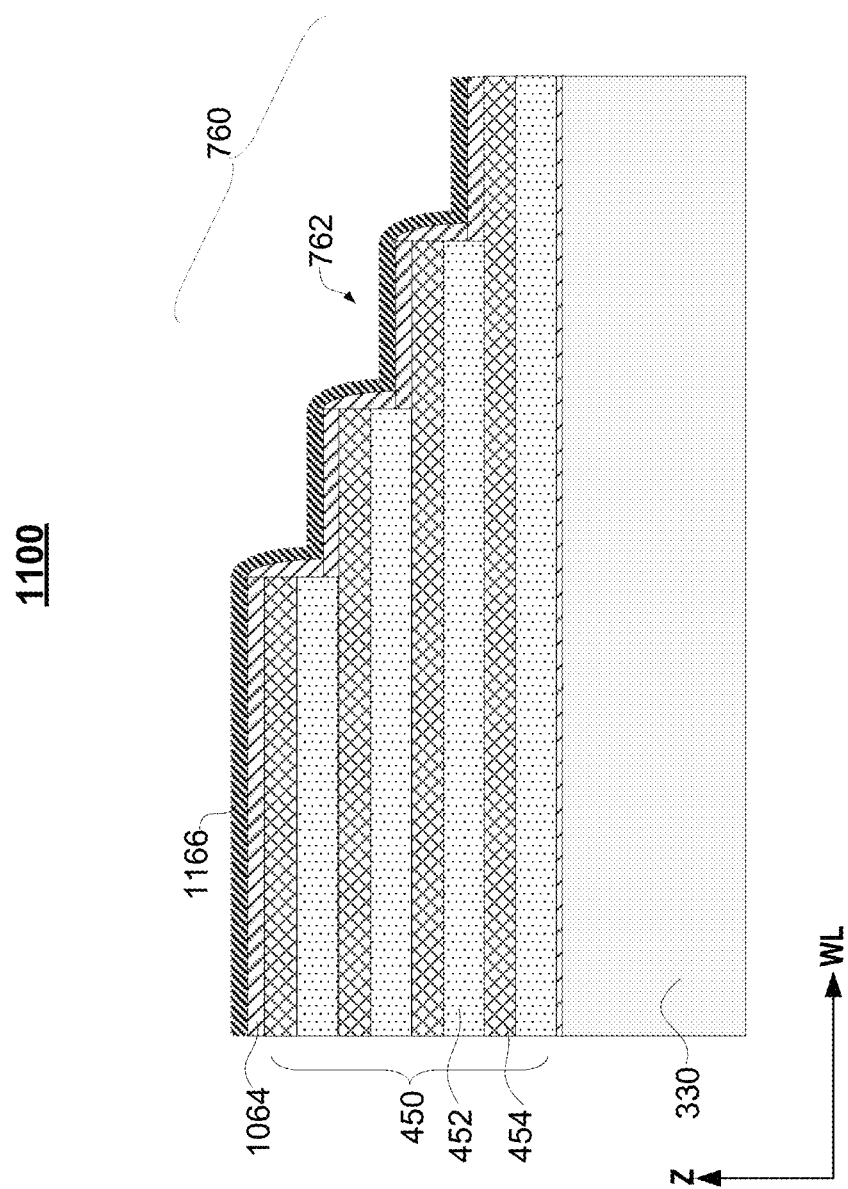
FIG. 11 illustrates a cross-sectional view of an exemplary structure of the 3D memory device at a certain process step, according to some embodiments of the present disclosure.

As shown in FIG. 11, the 3D memory structure 1100 includes a second barrier layer 1166 disposed over the 3D memory structure 1000 (in FIG. 10), on the first barrier layer 1064. The second barrier layer 1166 covers the first barrier layer 1064 on lateral surfaces. In some embodiments, the second barrier layer 1166 also covers the first barrier layer 1064 on vertical sidewalls. The second barrier layer 1166 on lateral surfaces and vertical sidewalls can have the same or different thicknesses. In some embodiments, the second barrier layer 1166 can be non-conformal, where thicknesses of the second barrier layer 1166 on vertical sidewalls is thinner than that on lateral surfaces. As discussed below, the second barrier layer 1166 can be used as an etch-stop layer to form contact structures on the staircase steps. Therefore, the second barrier layer 1166 with a larger thickness on the lateral surfaces of the staircase steps is preferable. In some embodiments, the second barrier layer 1166 and the first barrier layer 1064 can cover the lateral surfaces and vertical sidewalls of the second staircase structures 760 and dividing wall 865 of the alternating dielectric stack 450 (shown in FIGS. 8-9).

In some embodiments, the second barrier layer 1166 can include any suitable dielectric material that is different from the first barrier layer 1064. The second barrier layer 1166 can include, for example, silicon oxide, silicon nitride, silicon oxynitrde, TEOS, high-k dielectric material ($Al_2O_3$, $HfO_2$, $Ta_2O_3$, $ZrO_2$, $La_2O_3$, etc.), or any combination thereof. The second barrier layer 1166 can be disposed by any suitable thin film deposition techniques such as CVD (e.g., PECVD, LPCVD, RTCVD, HDP-CVD, MOCVD, etc.), ALD, PVD, sputtering, evaporation, etc. In some embodiments, the second barrier layer 1166 can be silicon nitride; the first barrier layer 1064 can be silicon oxide; the first dielectric layer 452 can be silicon oxide; and the second dielectric layer 454 can be silicon nitride. In this example, the first barrier layer 1064 and the first dielectric layer 452 can be used as an etch-stop layer when removing the second dielectric layer 454. As the first barrier layer 1064 is positioned between the second dielectric layer 454 and the second barrier layer 1166 on lateral surfaces and vertical sidewalls, the first barrier layer 1064 can protect the second barrier layer 1166 from being etching when removing the second dielectric layer 454.

Referring to FIG. 4, at process step S430, a block mask can be disposed to cover a first region in a center of the second staircase structure. A top-down view of an exemplary 3D memory structure 1200 is shown in FIG. 12, according to the process step S430.

Figure 12:
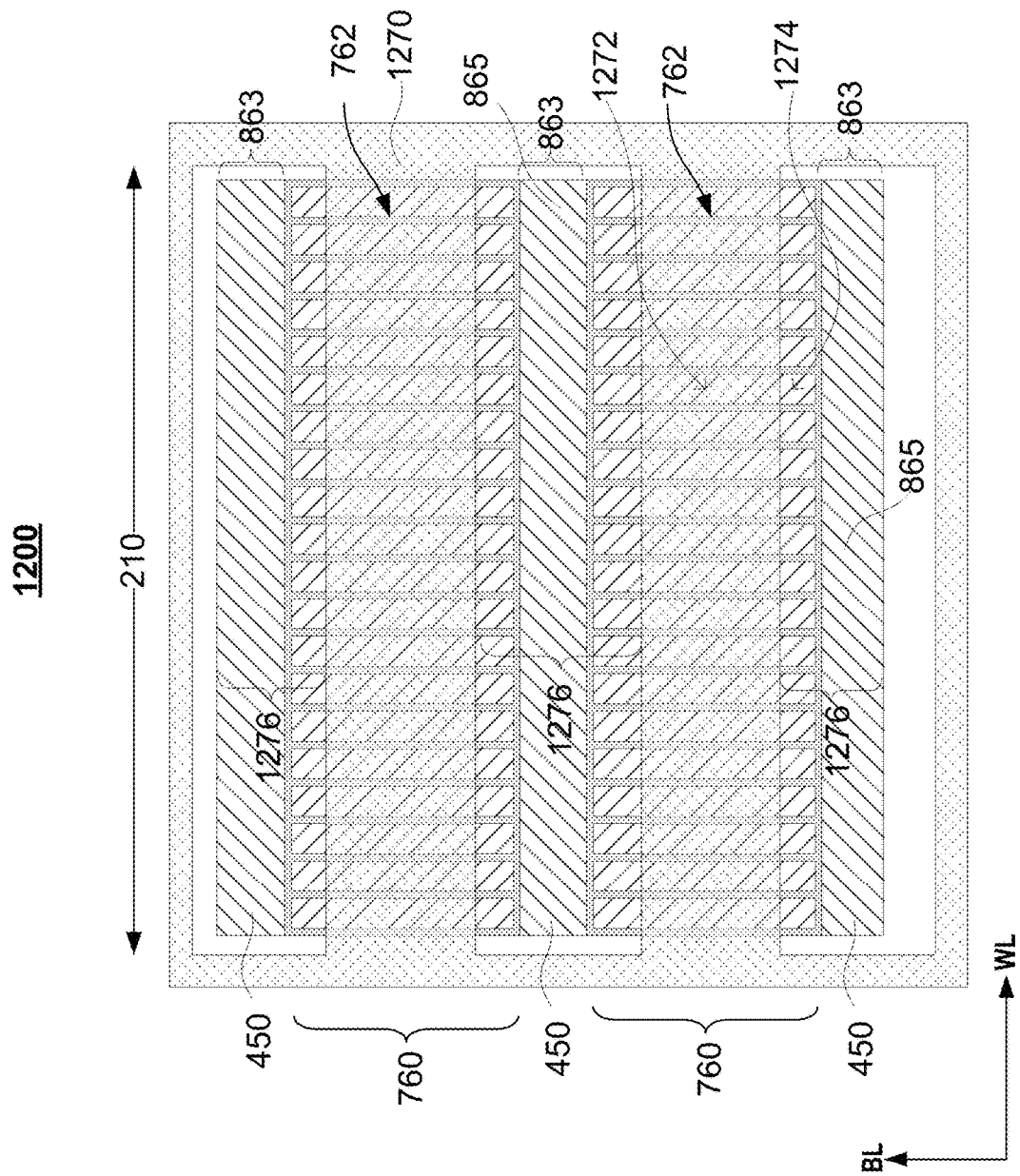
FIG. 12 illustrates a top-down view of an exemplary structure of the 3D memory device at a certain process step, according to some embodiments of the present disclosure.

As shown in FIG. 12, the 3D memory structure 1200 includes a block mask 1270 disposed on the 3D memory structure 1100 (in FIG. 11). The block mask 1270 is configured to expose portions of the alternating dielectric stack 450 that are adjacent to the second staircase structure 760. For example, the block mask 1270 exposes the dividing wall 865 in the dividing region 863 located adjacent to the second staircase structure 760. In some embodiments, the block mask 1270 also exposes a portion of the second staircase structure 760 adjacent to the dividing region 863 and the dividing wall 865. In the other words, the block mask 1270 covers a first region 1272 in a central of the second staircase structures 760. The first region 1272 extends in the WL-direction. The second staircase structure 760 can include a first region 1272 covered by the block mask 1270 and a second region 1274 exposed by the block mask 1270. In some embodiments, the second region 1274 does not comprise the second barrier layer 1166. The second region 1274 also extends in the WL-direction and is positioned between the dividing wall 865 and the first region 1272. The exposed portion of the second staircase structure 760 in the second region 1274 and the exposed dividing wall 865 together are also referred to as an exposed structure 1276. The block mask can be used in the subsequent process to remove a portion of the second barrier layer 1166 disposed on the exposed structure 1276.

The block mask 1270 can include any suitable photoresist. In some embodiments, the block mask 1270 can also include a hard mask, for example, silicon oxide, silicon nitride, TEOS, amorphous silicon, or polycrystalline silicon, spin-on-glass, or any combination thereof. In some embodiments, the bock mask 1270 can also include a carbon-based polymer material, a silicon-containing anti-reflective coating (SiARC), etc. The block mask 1270 can be formed through lithography, where patterns can be transferred from a reticle to the block mask 1270. In some embodiments, forming the block mask 1270 can also include a dry etching (e.g., reactive ion etching), a wet etching, or a combination thereof.

It is noted that the second barrier layer 1166 and the first barrier layer 1064 are omitted in the top-down view of FIG. 12 for clarity.

Referring to FIG. 4, at process step S435, the second barrier layer can be removed from the structures exposed by the block mask. A top-down view and various cross-sectional views of an exemplary 3D memory structure 1300 are shown in FIGS. 13A-13D, according to the process step S435.

FIG. 13B illustrates a cross-sectional view along a line BB' in FIG. 13A, which is in the second region 1274 of the second staircase structure 760. FIG. 13C illustrates a cross-sectional view along the line CC' in FIG. 13A, which is in the first region 1272 of the second staircase structure 760. As discussed previously, the block mask 1270 covers the first region 1272 of the second staircase structure 760. The block mask exposes the exposed structure 1276, including the second region 1274 of the second staircase structure 760 and the dividing walls 865 in the dividing regions 863. Therefore, the second barrier layer 1166 can be removed from the exposed structures 1276, for example, in the second region 1274 of the second staircase structure 760. Similarly, the second barrier layer 1166 can also be removed from the dividing walls 865 in the dividing regions 863. Namely, a first portion of the second barrier layer 1166 (or the dielectric material) can be removed from the dividing wall 865. And a second portion of the second barrier layer 1166 can be removed from the second region 1274 of the second staircase structure 760. As such, the second barrier layer 1166 can be formed in the first region of the staircase structure.

In some embodiments, the second barrier layer 1166 can be selectively removed with respect to the first barrier layer 1064. For example, the second barrier layer 1166 can be etched with a rate much higher than that of the first barrier layer 1064. The second barrier layer 1166 can be removed by using any suitable etching process, e.g., dry etch, wet etch, or a combination thereof. In some embodiments, the second barrier layer 1166 can be etched by RIE.

Figure 13D:
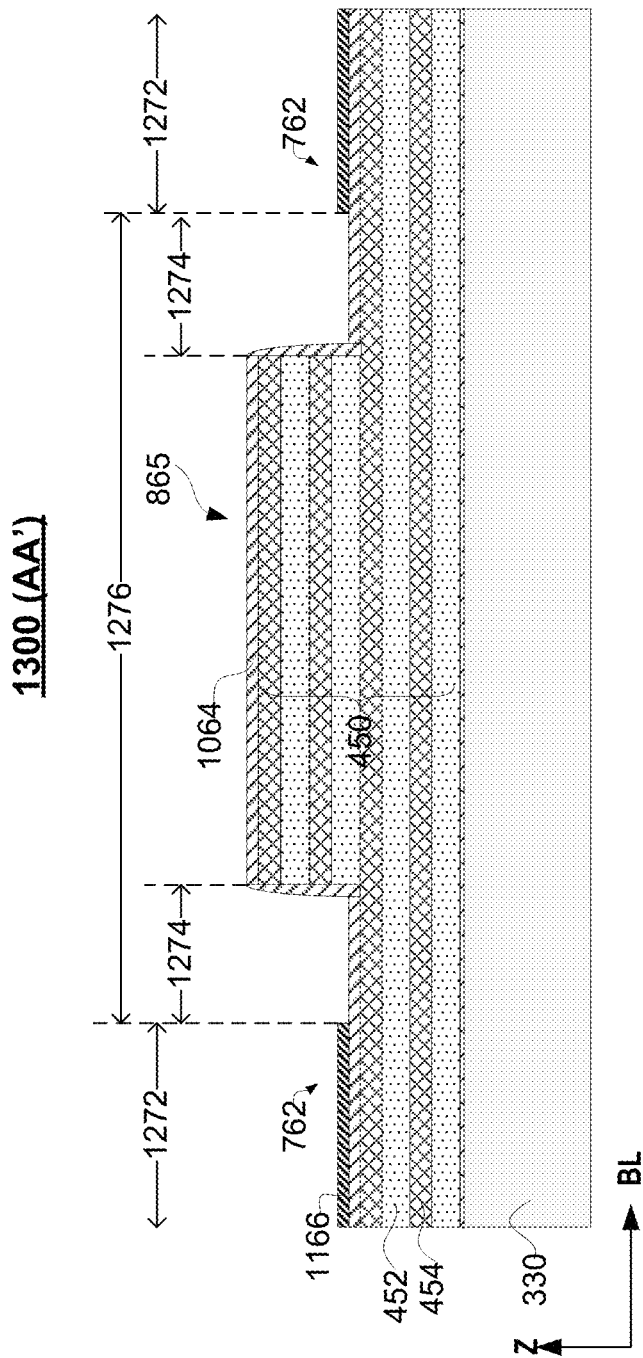

FIG. 13D illustrates a cross-sectional view along a line AA' in FIG. 13A, which is across the exposed structure 1276 and the first region 1272 of the second staircase structure 760. Because of the topology between the dividing wall 865 and the second staircase steps 762, in some embodiments, the second barrier layer 1166 and the first barrier layer 1064 can cover sidewalls of the dividing wall 865. See also FIG. 9. In some embodiments, during the process step S435, the second barrier layer 1166 on the sidewalls of the dividing wall 865 can also be removed, stopping on the first barrier layer 1064 underneath. In this example, the removal of the second barrier layer 1166 from the sidewalls of the dividing wall 865 can be performed by an isotropic etching process (e.g., isotropic RIE, wet etch, etc.), where the second barrier layer 1166 can also be etched laterally in addition to etching in the vertical direction.

As the storage capacity of the 3D NAND memory increases, the number of the first dielectric layers 452 and the second dielectric layers 454 also increases. As a result, the topology between the dividing wall 865 and the second staircase structure 760 increases too. By using the block mask 1270, the second barrier layer 1166 can be etched isotropically (i.e., vertically and laterally), which can greatly reduce etching time and the risk of over-etching on lateral surfaces.

After removing the second barrier layer 1166 from the exposed structure 1276, the block mask 1270 (in FIG. 12) can be stripped. As shown in FIGS. 13A-13D, after completing the process step S435, the second barrier layer 1166 covers in the first region 1272 of the second staircase structure 760, where the second barrier layer 1166 can be removed from other regions.

Referring to FIG. 4, at process step S440, an insulating layer can be disposed on the second staircase structure and the dividing wall of the alternating dielectric stack. Cross-sectional views of an exemplary 3D memory structure 1400 are shown in FIGS. 14A-14C along the lines AA', BB' and CC' (see FIG. 13A), respectively, according to the process step S440.

As shown in FIGS. 14A-14C, the 3D memory structure 1400 includes an insulating layer 1480 disposed on the second barrier layer 1166 and the first barrier layer 1064 over the second staircase structure 760 and the dividing wall 865 of the alternating dielectric stack 450. The insulating layer 1480 covers at least a top surface (a surface farther away from the substrate 330) and sidewalls of the second barrier layer 1166. The insulating layer 1480 can protect the second barrier layer 1166 from being etched in the subsequent process when the second dielectric layer 454 is removed.

The insulating layer 1480 can include any suitable insulating material, for example, silicon oxide, silicon oxynitride, silicon nitride, TEOS, spin-on-glass, low-k dielectric material, such as carbon-doped oxide (CDO or SiOC or SiOC:H), or fluorine doped oxide (SiOF), etc. The insulating layer 1480 can be disposed by CVD, PVD, ALD, sputtering, evaporating, etc. In some embodiments, the insulating layer 1480 can have a planar top surface over the second staircase structure 760 and the dividing wall 865 of the alternating dielectric stack 450. The insulating layer 1480 can be planarized using CMP.

Referring to FIG. 4, at process step S445, a gate line slit (GLS) opening can be formed in the dividing wall, where the GLS opening penetrates vertically through the alternating dielectric stack. A top-down view and a cross-sectional view of an exemplary 3D memory structure 1500 are shown in FIGS. 15A-15B, according to the process step S445.

Figure 15A:
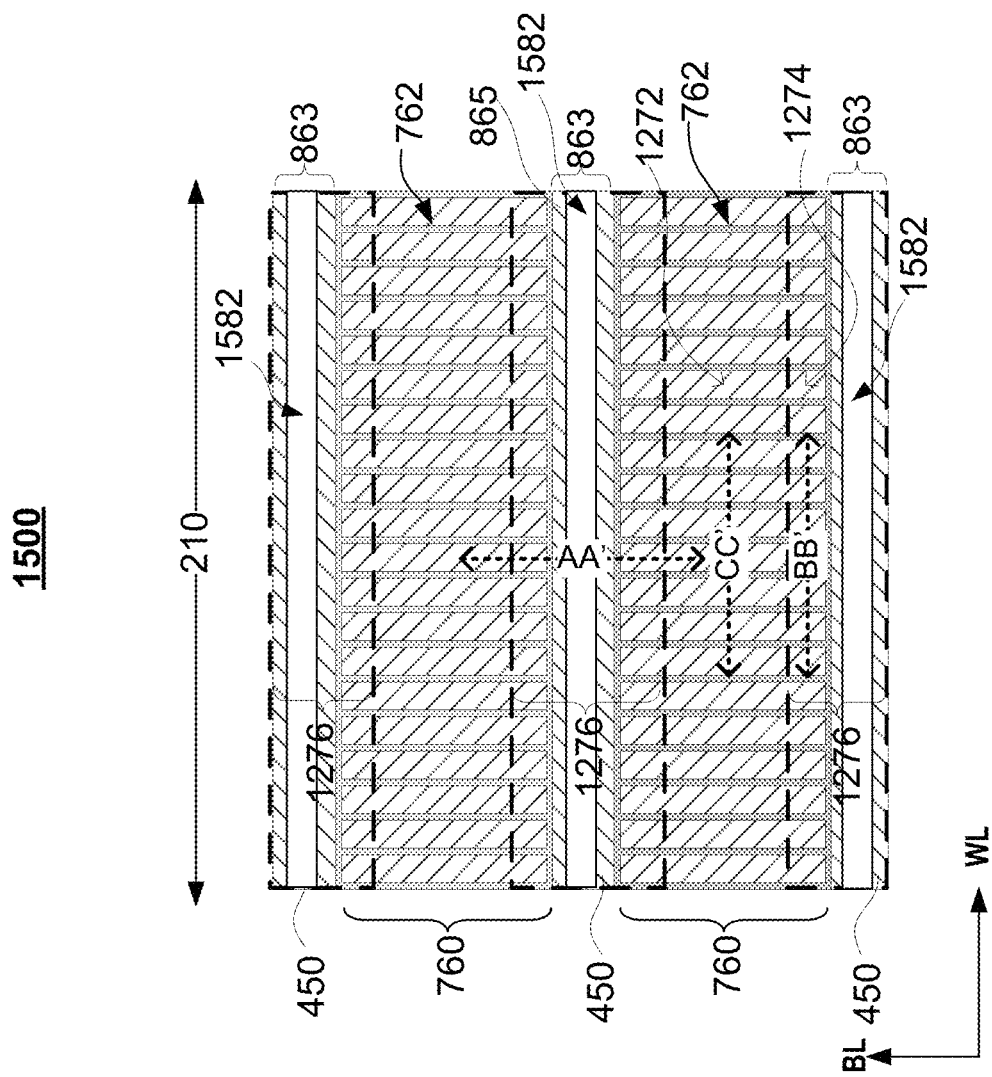
FIGS. 15A-15B illustrate a top-down view and a cross-sectional view of an exemplary structure of the 3D memory device at a certain process step according to some embodiments of the present disclosure.

As shown in FIG. 15A, the 3D memory structure 1500 includes a GLS opening 1582 extends laterally along the WL-direction, parallel to the second staircase structure 760.

In some embodiments, the GLS opening 1582 can be formed in the dividing wall 865 of the alternating dielectric stack 450.

Figure 15B:
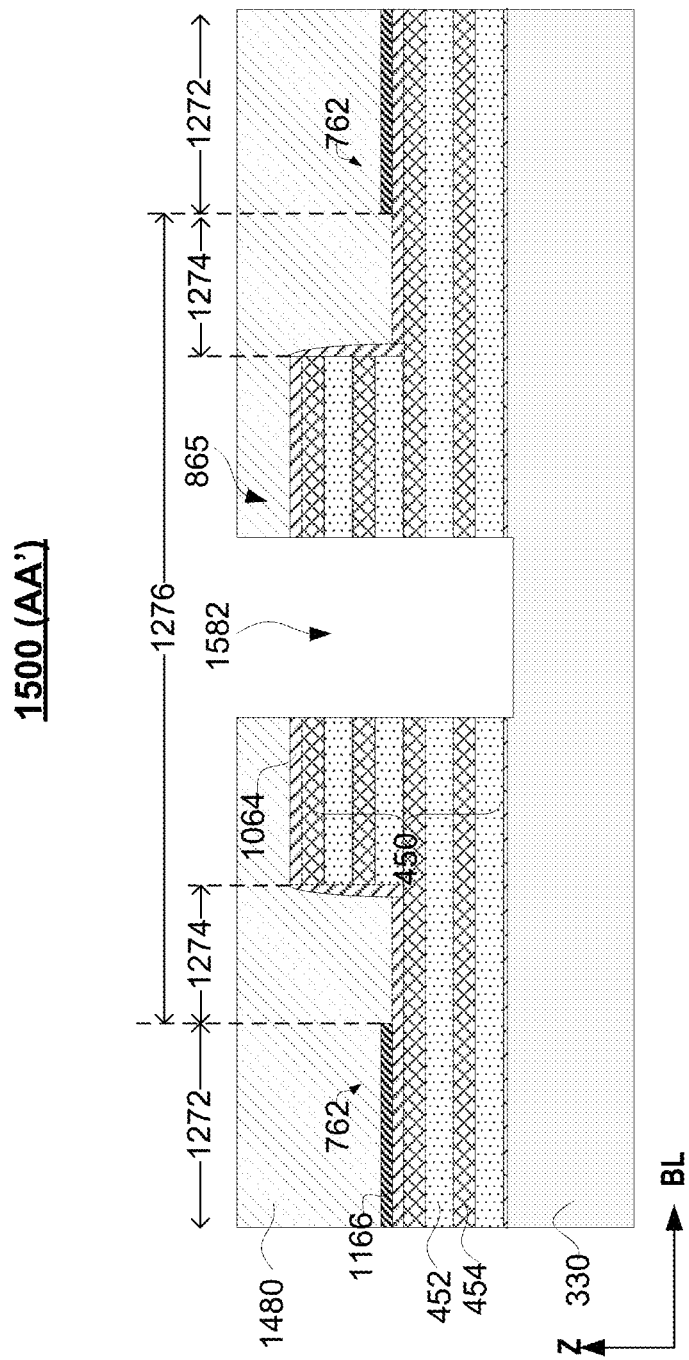

FIG. 15B illustrates a cross-sectional view along the line AA' in FIG. 15A. The GLS opening 1582 penetrates through the insulating layer 1480 and the dividing wall 865 of the alternating dielectric stack 450 in the z-direction perpendicular to the substrate 330. In some embodiments, the GLS opening 1582 extends further into the substrate 330. The GLS opening 1582 can be formed by a lithography process and an etching process. The etching process can include any suitable dry etching, wet etching or a combination thereof.

As discussed previously, the second barrier layer 1166 can be removed from the exposed structures 1276 at process step S435. Therefore, the GLS opening 1582 is distant (or away) from the second barrier layer 1166 in the BL-direction (also referred to as a third direction that is parallel to the substrate 330 and is perpendicular to the WL-direction or the second direction), where the second barrier layer 1166 is located in the first region 1272 on the second staircase steps 762. As a result, the second barrier layer 1166 can be covered by the insulating layer 1480 from a top and sides, and is not exposed by the GLS opening 1582.

Referring to FIG. 4, at process step S450, the second dielectric layers in the alternating dielectric stack (including the dividing wall and the second staircase structure) can be removed through the GLS opening. Cross-sectional views of an exemplary 3D memory structure 1600 are shown in FIGS. 16A-16C, along the lines AA', BB' and CC' (see FIG. 15A), respectively, according to the process step S450.

Figure 16A:
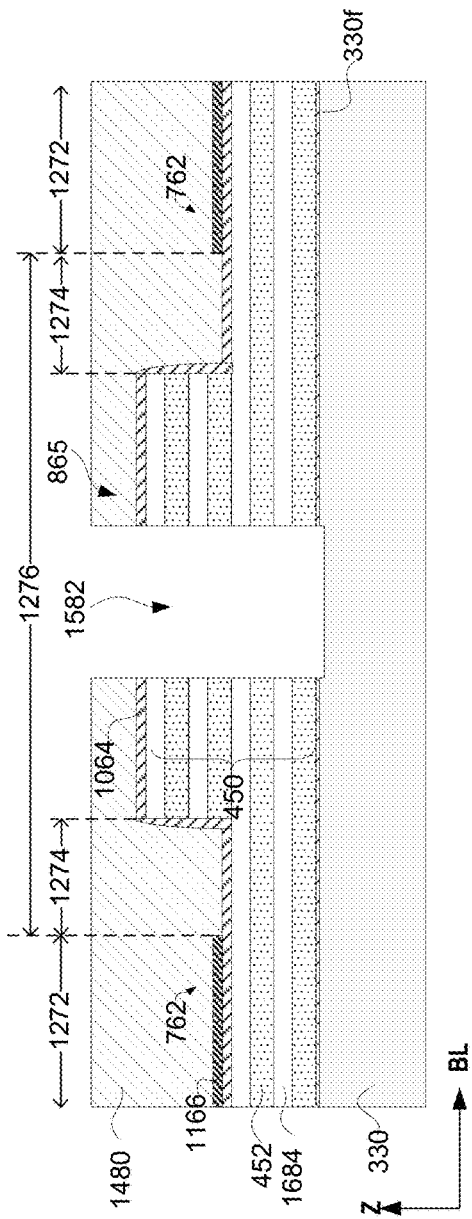
FIGS. 16A-16C illustrate various cross-sectional views of an exemplary structure of the 3D memory device at a certain process step according to some embodiments of the present disclosure.
Figure 16C:
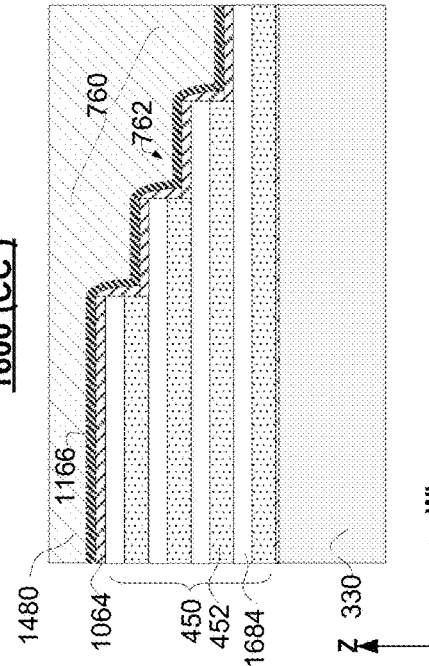
Figure 16B:
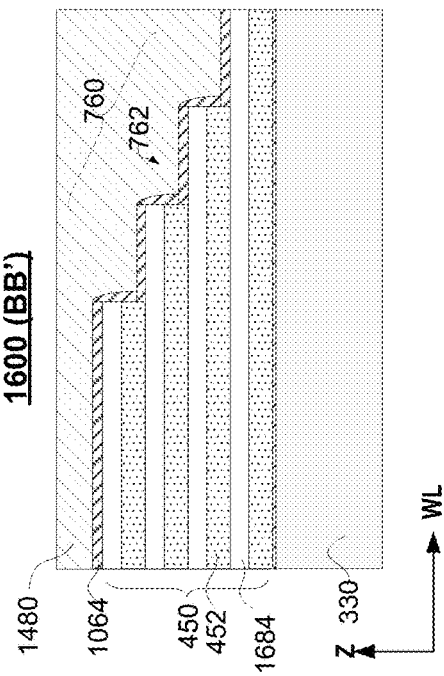

As shown in FIGS. 16A-16C, the 3D memory structure 1600 includes lateral tunnels 1684, where the second dielectric layers 454 of the alternating dielectric stack 450 can be removed selectively with respect to the first dielectric layers 452 and the first barrier layer 1064. The lateral tunnels 1684 can extend in a lateral direction between adjacent first dielectric layers 452. It is noted that, the term "lateral/laterally" used herein means the plane parallel to the top surface 330f of the substrate 330.

As discussed previously, the second dielectric layers 454 in the alternating dielectric stack 450 (see FIG. 15B) can also be referred to as sacrificial layers, and can be removed selectively from between the first dielectric layers 452. In the other words, the etching process of the second dielectric layers 454 can be stopped on the first dielectric layers 452. The second dielectric layers 454 can be removed by an isotropic dry etch and/or wet etch. The plasma and/or chemical used in the dry/wet etch can travel vertically and laterally from the GLS openings 1582. For example, the plasma and/or chemical can travel along the WL-direction and/or the BL-direction from the GLS openings 1582 towards the second staircase structure 760 (see also FIG. 15A). In some embodiments, the second dielectric layer 454 can be silicon nitride, and the first dielectric layer 452 can be silicon oxide. In this example, the second dielectric layer 454 can be removed by RIE using one or more etchants of $CF_4$, $CHF_3$, $C_4F_8$, $C_4F_6$, and $CH_2F_2$, etc. In some embodiments, the second dielectric layer 454 can be removed using wet etch, such as phosphoric acid.

When the etching process used for removing the second dielectric layers 454 (e.g., silicon nitride) is selective to the first barrier layer 1064 (e.g., silicon oxide), the first barrier layer 1064 disposed on the second staircase structures 760 can also function as an etch-stop layer, in addition to the first dielectric layer 452 (e.g., silicon oxide). For example, when the second barrier layer 1166 and the second dielectric layer 454 can both be removed during the process step S450 (i.e., both including silicon nitride), the first barrier layer 1064 that covers top surfaces (i.e., lateral surfaces) and vertical surfaces (i.e. sidewalls) of the second staircase steps 762 can protect the second barrier layer 1166 from being etched from the lateral tunnels 1684 underneath (see FIG. 16C). The portion of the first barrier layer 1064 formed on the lateral surface of the staircase structure can function as an etch-stop layer for an etching process in the z-direction direction perpendicular to the substrate 330. The portion of the first barrier layer 1064 formed on the vertical sidewalls of the staircase structure 760 can function as an etch-stop layer for an etching process in the WL-direction and the BL-direction parallel to the front surface 330f of the substrate 330.

As discussed previously, by using the block mask 1270 at the process steps S430 and S435, the second barrier layer 1166 can be removed from the exposed structures 1276 and thereby is distant or away from the GLS openings 1582. The second barrier layers 1166 can be covered and protected by the insulating layer 1480 near the dividing walls 865. Therefore, etching chemistry traveling through the GLS openings 1582 will not attack the second barrier layer 1166 (see FIG. 16A) and will not form an extra lateral tunnel on top of the first barrier layer 1064.

Referring to FIG. 4, at process step S455, a first conductive material can be disposed inside the lateral tunnels through the GLS openings to form conductive layers in between the first dielectric layers. Cross-sectional views of an exemplary 3D memory structure 1700 are shown in FIGS. 17A-17C, along the lines AA', BB' and CC' (see FIG. 15A), respectively, according to the process step S455.

Figure 17A:
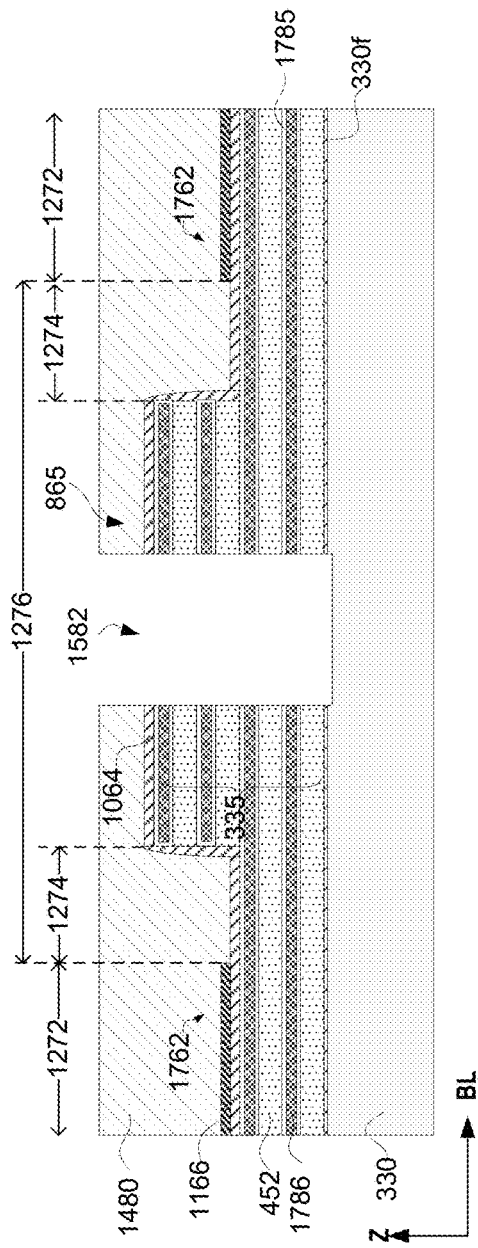
FIGS. 17A-17C illustrate various cross-sectional views of an exemplary structure of the 3D memory device at a certain process step according to some embodiments of the present disclosure.
Figure 17C:
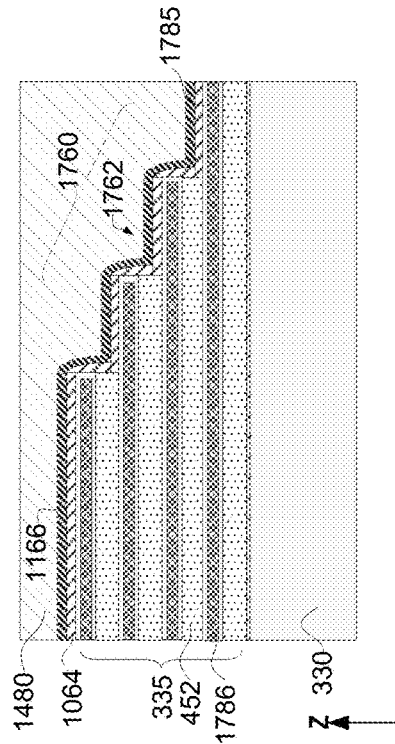
Figure 17B:
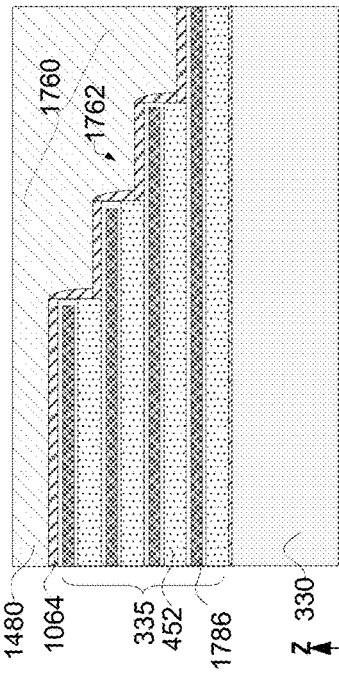

As shown in FIGS. 17A-17C, the 3D memory structure 1700 includes conductive layers 1786 disposed inside the lateral tunnels 1684 (in FIGS. 16A-16C) through the GLS openings 1582. The conductive layers 1786 can be disposed in between adjacent first dielectric layers 452, where the conductive layers 1786 and the first dielectric layers 452 can form the film stack 335 of alternating conductive and dielectric layers (as in FIG. 3).

In some embodiments, the conductive layer 1786 can be formed by filling the lateral tunnels with the first conductive material. The first conductive material for the conductive layer 1786 can include metal or metal alloys such as tungsten (W), aluminum (Al), titanium (Ti), copper (Cu), cobalt (Co), nickel (Ni), titanium nitride (TiN), tungsten nitride (WN), tantalum (Ta), tantalum nitride (TaN), AlTi, or any combination thereof. In some embodiments, the first conductive material for the conductive layer 1786 can also include poly-crystalline semiconductors, such as poly-crystalline silicon, poly-crystalline germanium, poly-crystalline germanium-silicon and any other suitable material, and/or combinations thereof. In some embodiments, the poly-crystalline material can be incorporated with any suitable types of dopant, such as boron, phosphorous, arsenic, or any combination thereof. In some embodiments, the first conductive material can also be amorphous semiconductors such as amorphous silicon. In some embodiments, the first conductive material can be disposed using a suitable deposition method such as chemical vapor deposition (CVD) (e.g., LPCVD, PECVD, MOCVD, RTCVD, etc.), physical vapor deposition (PVD), sputtering, evaporation, atomic layer deposition (ALD), or any combination thereof. In some embodiments, the conductive layers 1786 (or the first conductive material) include tungsten (W) deposited by CVD.

In some embodiments, a gate dielectric layer 1785 can be disposed inside the lateral tunnels 1684 (in FIGS. 16A-16C) prior to disposing the conductive layer 1786. In some embodiments, the gate dielectric layer 1785 surrounds the conductive layer 1786. For example, in the z-direction, the gate dielectric layer 1785 is disposed between the first dielectric layer 452 and the conductive layer 1786. In the WL-direction or BL-direction, the gate dielectric layer 1785 is disposed between the conductive layer 1786 and the first barrier layer 1064. The gate dielectric layer 1785 can include any suitable insulator, for example, silicon oxide, silicon nitride, silicon oxynitride, and/or any suitable combinations thereof. The gate dielectric layer 1785 can also include high-k dielectric materials, such as hafnium oxide, zirconium oxide, aluminum oxide, tantalum oxide, lanthanum oxide, and/or any combination thereof. The gate dielectric layer 1785 can be disposed by one or more suitable deposition processes, such as CVD, PVD, and/or ALD.

In some embodiments, etching and cleaning processes can be used to remove excess first conductive material on sidewalls of the GLS openings 1582. As such, each conductive layer 1786 of the film stack 335 can be electrically isolated from each other. In some embodiments, excess first conductive material on top of the insulating layer 1480 can also be removed, for example, by CMP.

After completing the process step S455, the second dielectric layers 454 can be replaced by the conductive layers 1786 and the alternating dielectric stack 450 becomes the film stack 335 of alternating conductive and dielectric layers. Accordingly, the second staircase structure 760 becomes the third staircase structure 1760, and the second staircase steps 762 become the third staircase steps 1762.

However, if block mask 1270 is not used and the second barrier layer 1166 is not removed near the GLS openings 1582 (see FIGS. 21A-21C), the second barrier layer 1166 can be removed together with the second dielectric layer 454 at the process step S450, if the second barrier layer 1166 and the second dielectric layer 454 are made of the same material, for example, silicon nitride. An additional tunnel 2184 can be formed under the insulating layer 1480. During the process step S455, an additional conductive layer 2186 can also be formed under the insulating layer 1480. The additional conductive layer 2186 can cause circuit shots and/or increase leakage. Furthermore, to completely fill the additional tunnel 2184, the thickness "t" of the additional conductive layer 2186 needs to be at least the thickness of the second barrier layer 1166. However, if the GLS openings 1582 are not wide enough, e.g., having a width w<t, the GLS opening 1582 can be filled and pitched off before the additional tunnel 2184 can be filled up. The resulting seams in the additional conductive layer 2186 can cause structural issues (e.g., degrading mechanical strength, attracting defects and chemicals, etc.) and thereby reduce product yield. Therefore, removing the second barrier layer 1166 by using the blocking mask 1270 can improve fabrication process for the 3D NAND flash memory.

Referring to FIG. 4, at process step S460, a GLS filler can be disposed inside the GLS opening to form a GLS. A top-down view and a cross-sectional view of an exemplary 3D memory structure 1800 are shown in FIGS. 18A-18B, according to the process step S460.

Figures 18A, 18B:
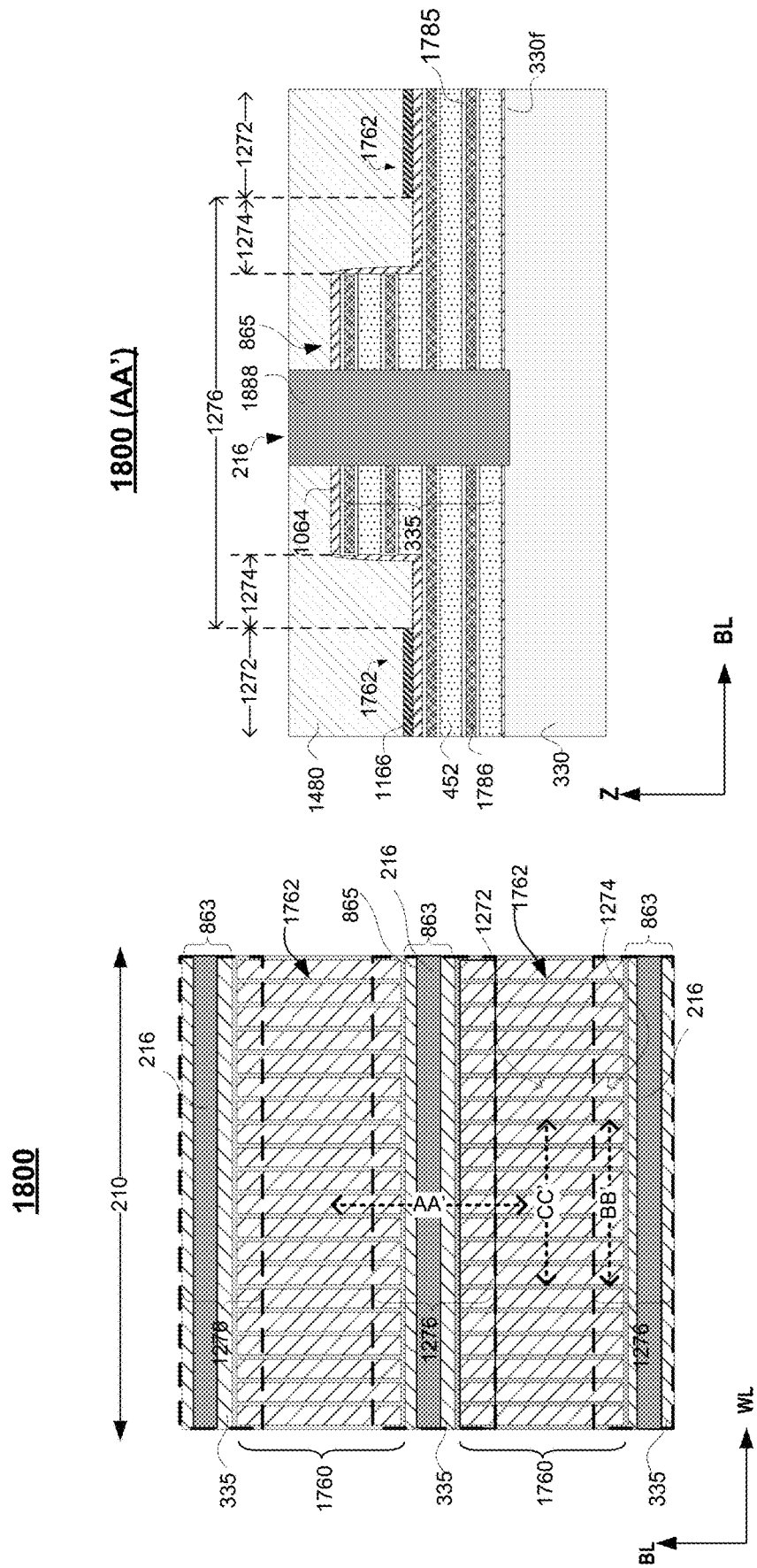
FIGS. 18A-18B illustrate a top-down view and a cross-sectional view of an exemplary structure of the 3D memory device at a certain process step according to some embodiments of the present disclosure.

As shown in FIGS. 18A and 18B (along the line AA'), the 3D memory structure 1800 includes the gate line slit (GLS) 216 (similar to the slit structure 216 in FIGS. 2-3) in between adjacent third staircase structures 1760. The GLS 216 can be formed in the dividing walls 865 in the dividing region 863. The GLS 216 extends laterally along the WL-direction.

The GLS 216 penetrates through the insulating layer 1480, the first barrier layer 1064 and the film stack 335 of alternating conductive and dielectric layers in the z-direction. In some embodiments, the GLS 216 can further extend into the substrate 330.

The GLS 216 includes a GLS filler 1888 disposed inside the GLS openings 1582 (in FIG. 17A). The GLS filler 1888 can include any suitable insulating material, for example, silicon oxide, silicon nitride, silicon oxynitride, boron or phosphorus doped silicon oxide, carbon-doped oxide (CDO or SiOC or SiOC:H), or fluorine doped oxide (SiOF), or any combination thereof. The GLS filler 1888 can be deposited by using, for example, ALD, CVD (e.g., PECVD, RTCVD, LPCVD, etc.), PVD, sputtering, evaporating, or any other suitable film deposition techniques.

In some embodiments, the GLS filler 1888 outside the GLS opening 1582 can be removed by etching (e.g., RIE) or CMP. As such, the GLS 216 can be coplanar with the insulating layer 1480.

As described with respect to FIGS. 2 and 3, the GLS 216 can divide a storage unit (e.g., the memory block 103) into sub-storage units (e.g., memory fingers 218), where the sub-storage units can perform read and/or program operations independently. As such, reading and programming speed can be improved for a 3D NAND memory.

Referring to FIG. 4, at process step S465, a contact opening can be formed to expose a portion of one of the conductive layers of the third staircase structure. A top-down view and a cross-sectional view of an exemplary 3D memory structure 1900 are shown in FIGS. 19A-19B, according to the process step S465.

As shown in FIG. 19A, the 3D memory structure 1900 includes a contact opening 1990 in the first region 1272 of the third staircase structure 1760. As shown in the cross-sectional view along the line CC' in FIG. 19B, the contact opening 1990 penetrate through the insulating layer 1480, the second barrier layer 1166 and the first barrier layer 1064 in the z-direction, and expose a portion of the conductive layer 1786. In some embodiments, each contact opening 1990 exposes a portion of one of the conductive layers 1786 of the third staircase structure 1760.

In some embodiments, forming the contact opening 1990 includes etching the insulating layer 1480 selectively with respect to the second barrier layer 1166, where the second barrier layer 1166 can function as an etch-stop. Then, the second barrier layer 1166 and the first barrier layer 1064 can be etched to expose a portion of the conductive layer 1786 inside the contact opening 1990.

In some embodiments, photoresist or polymer material can be used as a mask layer to etch the contact openings 1990. Due to the topology of the staircase structure, depths of the contact openings 1990 depends on the location of the staircase steps. The contact openings 1990 for the lower staircase steps can be much deeper than the contact openings 1990 for the upper staircase steps. Therefore, the contact openings 1990 for the third staircase steps 1762 closer to the substrate 330 requires longer etch time than the contact openings 1990 away from the substrate 330. A selective etching process can be used such that the etching rate of the insulating layer 1480 is much higher than the second barrier layer 1166. In the other words, during the etching process for contact openings 1990, the second barrier layer 1166 can function as an etch-stop layer and can protect the underlying structure until all the contact openings 1990 are formed on top of the second barrier layer 1166 for the third staircase structure 1760. Next, portions of the second barrier layer 1166 and the first barrier layer 1064 inside the contact openings 1990 can be removed.

In some embodiments, when a gate dielectric layer is disposed prior to disposing the conductive layer 1786, the etching also includes removing the gate dielectric layer inside the contact openings 1990.

The etching process for the contact openings 1990 can include dry etch, wet etch and/or a combination thereof. When the insulating layer 1480 is silicon oxide and the second barrier layer 1166 is silicon nitride, etching silicon oxide can use anisotropic RIE with chemical etchant, for example, $CF_4$, $CHF_3$, $C_2F_6$, $C_3F_6$, and/or any combination thereof, and etching silicon nitride can use RIE with chemical etchant, for example, $O_2$, $N_2$, $CF_4$, $NF_3$, $Cl_2$, HBr, $BCl_3$, and/or combinations thereof. The etching process and chemistry listed here are only examples and should not be so limited.

Because the second barrier layer 1166 can function as an etch-stop during the etching process for the contact openings 1990, the second barrier layer 1166 can include a thickness sufficient to protect underlying structures. For example, the second barrier layer 1166 can include a thickness in a range between 10 nm to 500 nm, more specifically between 50 nm to 500 nm. As discussed before with respect to FIGS. 16A-16C, 17A-17C and 21A-21B, by using the block mask 1270, the second barrier layer 1166 can be pulled back from the GLS openings 1582. The second barrier layer 1166 can be surrounded by the insulating layer 1480 and the first barrier layer 1064 during the removal of the second dielectric layers 454 and the formation of the lateral tunnels 1684. The additional tunnel 2184 and the additional conductive layer 2186 can thereby be avoided. Therefore, the thickness of second barrier layer 1166 can be optimized for the etching process of the contact openings 1990 without the limitation from the additional tunnel 2184 and/or the additional conductive layer 2186. Namely, the thickness of the second barrier layer 1166 can be increased to provide sufficient etch-stop function in forming the contacting openings 1990 on the third staircase structure 1760.

Figure 20B:
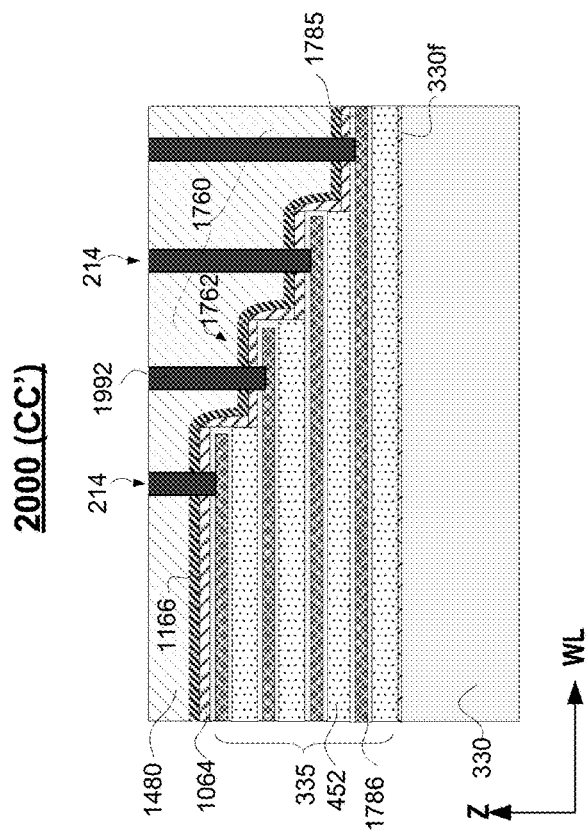
FIGS. 20A-20D illustrate a top-down view and various cross-sectional views of an exemplary structure of the 3D memory device at a certain process step according to some embodiments of the present disclosure.
Figure 20A:
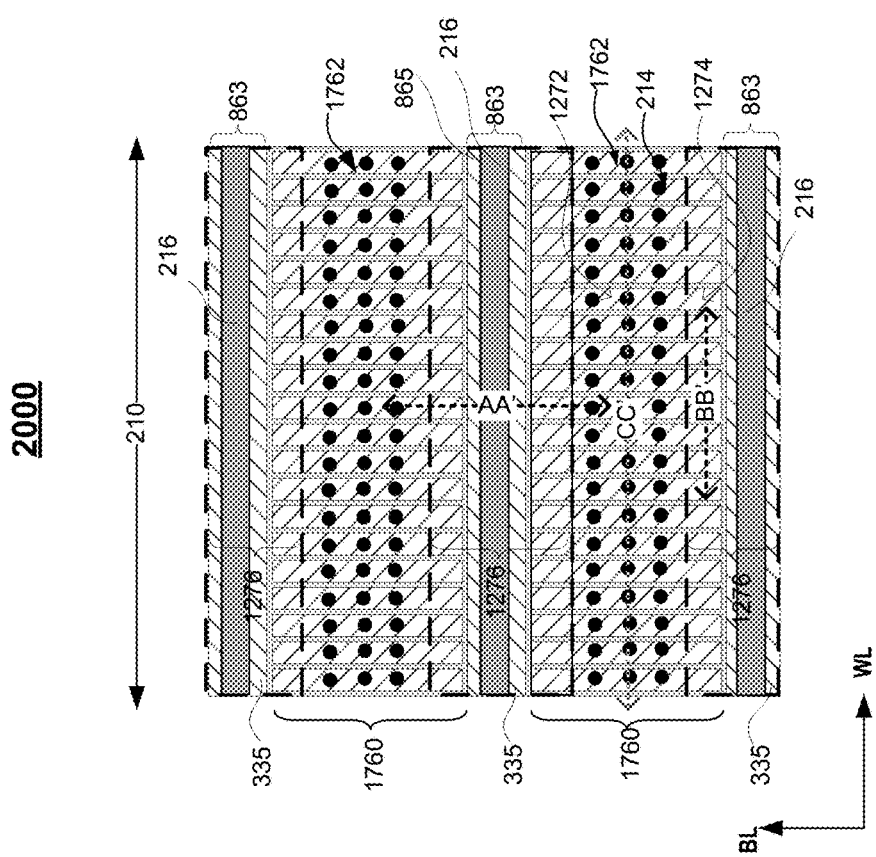
Figures 20C, 20D:
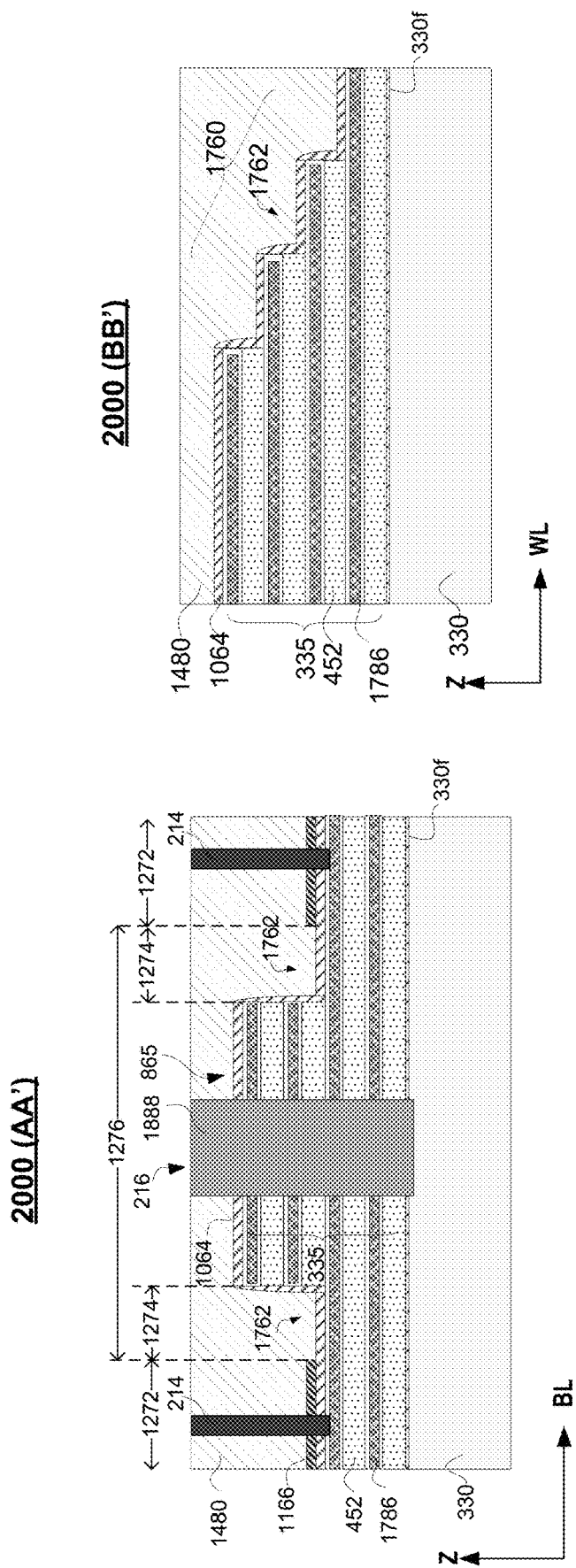

Referring to FIG. 4, at process step S470, a second conductive material can be disposed inside the contact opening to form the a contact structure for the third staircase structure. A top-down view of an exemplary 3D memory structure 2000 is shown in FIG. 20A, according to the process step S470. FIGS. 20B-20D show cross-sectional views of the 3D memory structure 2000 along the lines CC', AA' and BB' in FIG. 20A.

As shown in FIGS. 20A and 20B, the 3D memory structure 2000 includes a contact structure 214 in the first region 1272 of the third staircase structure 1760. The contact structure 214 (similar to the ones shown in FIGS. 2-3) include a second conductive material 1992 disposed inside the contact opening 1990 (in FIGS. 19A-19B). The contact structure 214 penetrates through the insulating layer 1480, the second barrier layer 1166 and the first barrier layer 1064 in the z-direction. The contact structure 214 can contact one of the conductive layers 1786 of the film stack 335 through the third staircase structure 1760. In some embodiments, when the gate dielectric layer 1785 is disposed prior to disposing the conductive layer 1786, the contact structure 214 also penetrates through the gate dielectric layer 1785.

In some embodiments, the second conductive material 1992 inside the contact opening 1990 can be in direct contact with the conductive layer 1072. The second conductive material 1992 can include any suitable conductive material, for example, a metal or metallic compound such as tungsten (W), aluminum (Al), copper (Cu), cobalt (Co), titanium (Ti), tantalum (Ta), titanium nitride (TiN), tantalum nitride (TaN), and/or any combination thereof. The metal or metallic compound can be disposed using a suitable deposition method such as CVD, PVD, ALD, sputtering, evaporation, etc. The second conductive material 1992 can also be a metal silicide, including WSix, CoSix, NiSix, or AlSix, etc. Metal silicide material can be formed by disposing a metal layer directly on a polycrystalline silicon layer inside the contact opening 1990 and then applying a thermal annealing process followed by removal of unreacted metal. In some embodiments, the second conductive material 1992 includes a combination of TiN/W/TiN deposited by CVD.

The forming of the contact structures 214 can also include a planarization process, e.g., CMP, to remove excess second conductive material 1992 on top of the insulating layer 1480. As shown in FIG. 20B, the contact structures 214 can be coplanar with the insulating layer 1480.

The present disclosure also provides a 3D memory device fabricated using the methods discussed above.

Referring to FIGS. 20A-20D, the 3D memory structure 2000 includes the film stack 335 of alternating conductive and dielectric layers. The film stack 335 includes the conductive layers 1786 and the first dielectric layers 452 alternatingly disposed on the substrate 330, stacking in the z-direction perpendicular to the substrate 330. In some embodiments, the first dielectric layers 452 include silicon oxide and the conductive layers includes tungsten.

The third staircase structure 1760 (also referred to as a staircase structure) can be disposed in the film stack 335 in the staircase region 210. The third staircase structure 1760 extends in the WL-direction and includes the third staircase steps 1762 (also referred to as staircase steps) going up and down along (i.e., facing) the WL-direction. The third staircase step 1762, or a "staircase layer", refers to a layer stack with the same lateral dimension in a surface parallel to the substrate surface 330f. Each of the third staircase steps terminates at a shorter length than the third staircase step underneath.

The film stack 335 also includes the dividing wall 865 in the dividing region 863. The dividing wall 865 extends parallel to the third staircase structure 1760 in the WL-direction. The dividing wall 865 is adjacent to the third staircase structure 1760.

The 3D memory structure 2000 also includes the first barrier layer 1064 and the second barrier layer 1166. The first barrier layer 1064 can be disposed on the third staircase structure 1760, covering top surfaces and sidewalls of the third staircase steps 1762. The second barrier layer 1166, different from the first barrier layer 1064, can be disposed on the first barrier layer 1064 in the first region 1272 of the third staircase structure 1760, where the first region 1272 is located in a center of the third staircase structure 1760. The first region 1272 extends along the WL-direction. In the other words, the second barrier layer 1166 can be disposed in the center of the third staircase structure 1760, covering center portions of the third staircase steps 1762. The second barrier layer 1166 can be removed from the second region 1274 of the third staircase structure 1760. The second region 1274, extending along the WL-direction, is adjacent to the dividing wall 865. In some embodiments, the second regions 1274 are located on each side of the first region 1272. In some embodiments, the first barrier layer includes silicon oxide and the second barrier layer includes silicon nitride. In some embodiments, the first barrier layer 1064 has a thickness in a range between 10 nm to 100 nm, and the second barrier layer 1166 has a thickness in a range between 50 nm to 500 nm.

The 3D memory structure 2000 also includes the GLS 216 penetrating vertically through the film stack 335 in the z-direction. In some embodiments, the GLS 216 extends further into the substrate 330. The GLS 216 extends parallel to the WL-direction and parallel to the third staircase structure 1760. The GLS 216 extends parallel to the first region 1272 and the second regions 1274 of the third staircase structure 1760. In some embodiments, the second barrier layer 1166 is distant from the GLS 216 in the BL-direction. The GLS 216 can include the GLS filler 1888, where the GLS filler 1888 can include any suitable insulating material, for example, silicon oxide, silicon nitride, silicon oxynitride, TEOS, etc.

The 3D memory structure 2000 also includes the insulating layer 1480 disposed on the first barrier layer 1064 and the second barrier layer 1166 over the third staircase structure 1760 and the dividing wall 865 of the film stack 335. In some embodiments, the GLS 216 can be coplanar with the insulating layer 1480. The GLS 216 is configured to divide a memory block into sub-storage units (e.g., memory fingers)

The 3D memory structure 2000 also include the contact structures 214 formed on the third staircase steps 1762 of the third staircase structure 1760, which can provide electrical connections to the conductive layers 1786 of the film stack 335 of alternating conductive and dielectric layers. In some embodiments, the contact structures 214 can be disposed in the first region 1272 of the staircase structure. The contact structures 214 penetrate vertically through the insulating layer, the second dielectric layer and the first dielectric layer to contact a portion of one of the conductive layers 1786 of the film stack 335.

In some embodiments, the conductive layers 1786 can be electrically connected to the bottom select gate 332 (in FIG. 3), the control gates or word lines 333 or the top select gate 334 of a 3D memory device. In some embodiments, the 3D memory device can include memory strings 212 (see FIGS. 2-3), penetrating vertically through the film stack 335 in the z-direction, where the intersection between the control gate 333 and the memory string 212 can form the memory cells 340 as shown in FIGS. 2-3.

Figure 22:
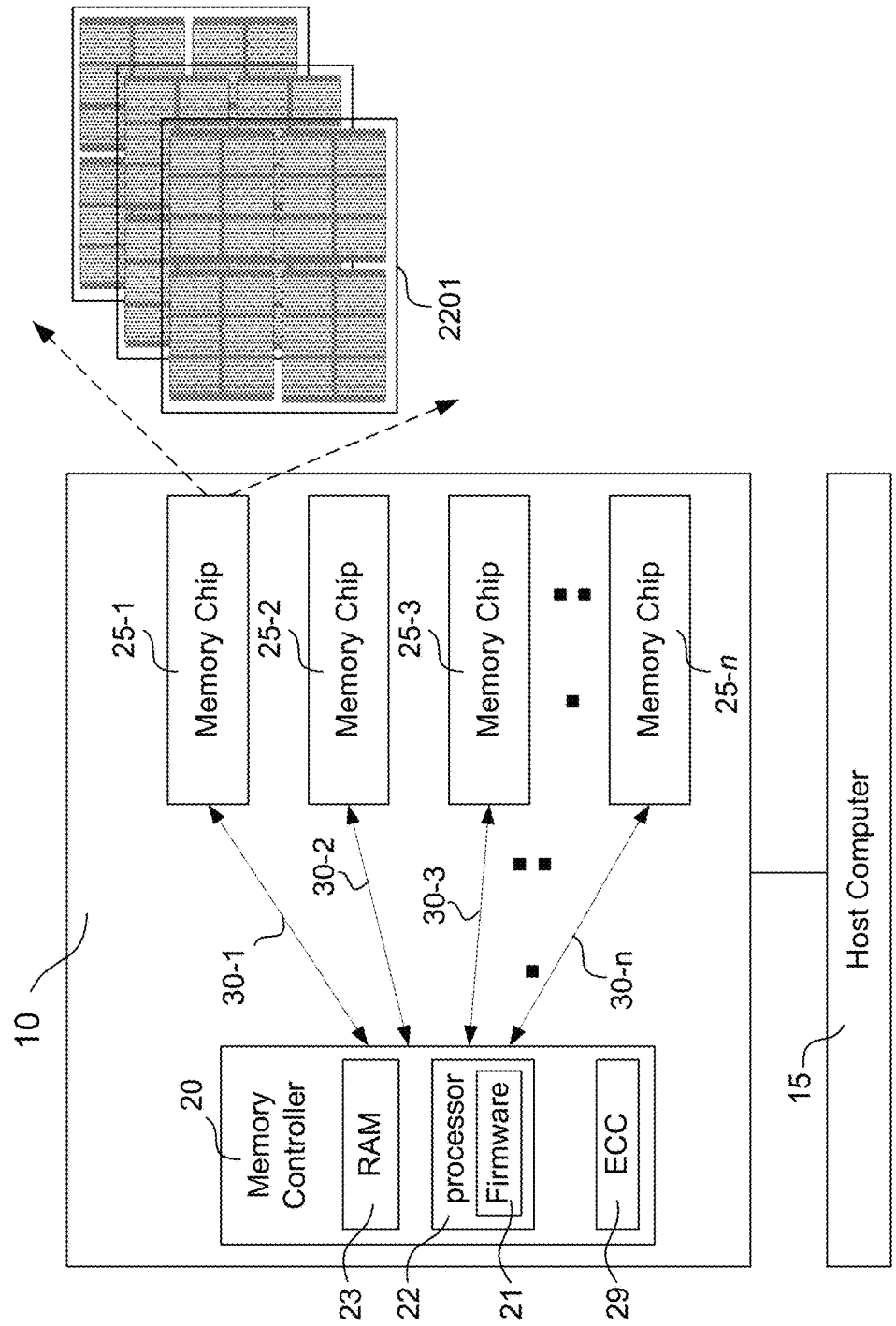
FIGS. 22 and 23A-23B illustrate a storage system with one or more memory chips, according to some embodiments of the present disclosure.

FIG. 22 illustrates a block diagram of an exemplary system S1 having a storage system 10, according to some embodiments of the present disclosure. System S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The storage system 10 (also referred to as a NAND storage system) can include a memory controller 20 and one or more semiconductor memory chips 25-1, 25-2, 25-3, . . . , 25-n. Each semiconductor memory chip 25 (hereafter just "memory chip") can be a NAND chip (i.e., "flash," "NAND flash" or "NAND"). The storage system 10 can communicate with a host computer 15 through the memory controller 20, where the memory controller 20 can be connected to the one or more memory chips 25-1, 25-2, 25-3, . . . , 25-n, via one or more memory channels 30-1, 30-2, 30-3, . . . , 30-n. In some embodiments, each memory chip 25 can be managed by the memory controller 20 via a memory channel 30.

In some embodiments, the host computer 15 can include a processor of an electronic device, such as a central processing unit (CPU), or a system-on-chip (SoC), such as an application processor (AP). The host computer 15 sends data to be stored at the NAND storage system or storage system 10 or retrieves data by reading the storage system 10.

The memory controller 20 can handle I/O requests received from the host computer 15, ensure data integrity and efficient storage, and manage the memory chip 25. To perform these tasks, the controller runs firmware 21, which can be executed by one or more processors 22 (e.g., microcontroller units, CPU) inside the controller 20. For example, the controller 20 runs firmware 21 to map logical addresses (i.e., address utilized by the host associated with host data) to physical addresses in the memory chip 25 (i.e., actual locations where the data is stored). The controller 20 also runs firmware 21 to manage defective memory blocks in the memory chip 25, where the firmware 21 can remap the logical address to a different physical address, i.e., move the data to a different physical address. The controller 20 can also include one or more memories 23 (e.g., DRAM, SRAM, EPROM, etc.), which can be used to store various metadata used by the firmware 21. In some embodiments, the memory controller 20 can also perform error recovery through an error correction code (ECC) engine 29. ECC can be used to detect and correct the raw bit errors that occur within each memory chip 25.

The memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 22 can include one or more memory dies 2201, where each memory die 2201 can include the 3D NAND memory 100 as shown in FIGS. 1-3. In some embodiments, each of the one or more memory dies 2201 can include the 3D memory device 2000 shown in FIGS. 20A-20D, which can be fabricated using the method 400 in FIG. 4. In some embodiments, the memory controller 20 can be configured to control operations of a three-dimensional memory device (e.g., the 3D NAND memory 100), the controller being connected with the three-dimensional memory device.

Figure 23A:
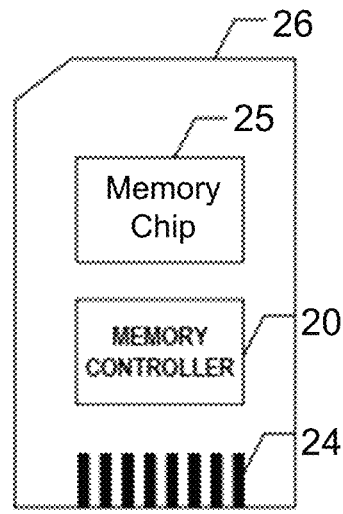
Figure 23B:
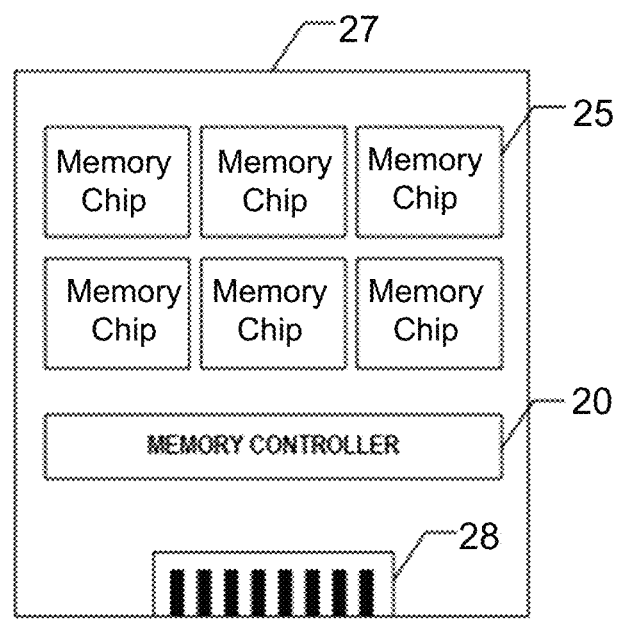

Memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 23A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host computer 15 in FIG. 22). In another example as shown in FIG. 23B, memory controller 20 and multiple memory chip 25 can be integrated into an solid state drive (SSD) 27. SSD 27 can further include an SSD connector 28 coupling SSD 27 with a host (e.g., the host computer 15 in FIG. 22).

Figure 24:
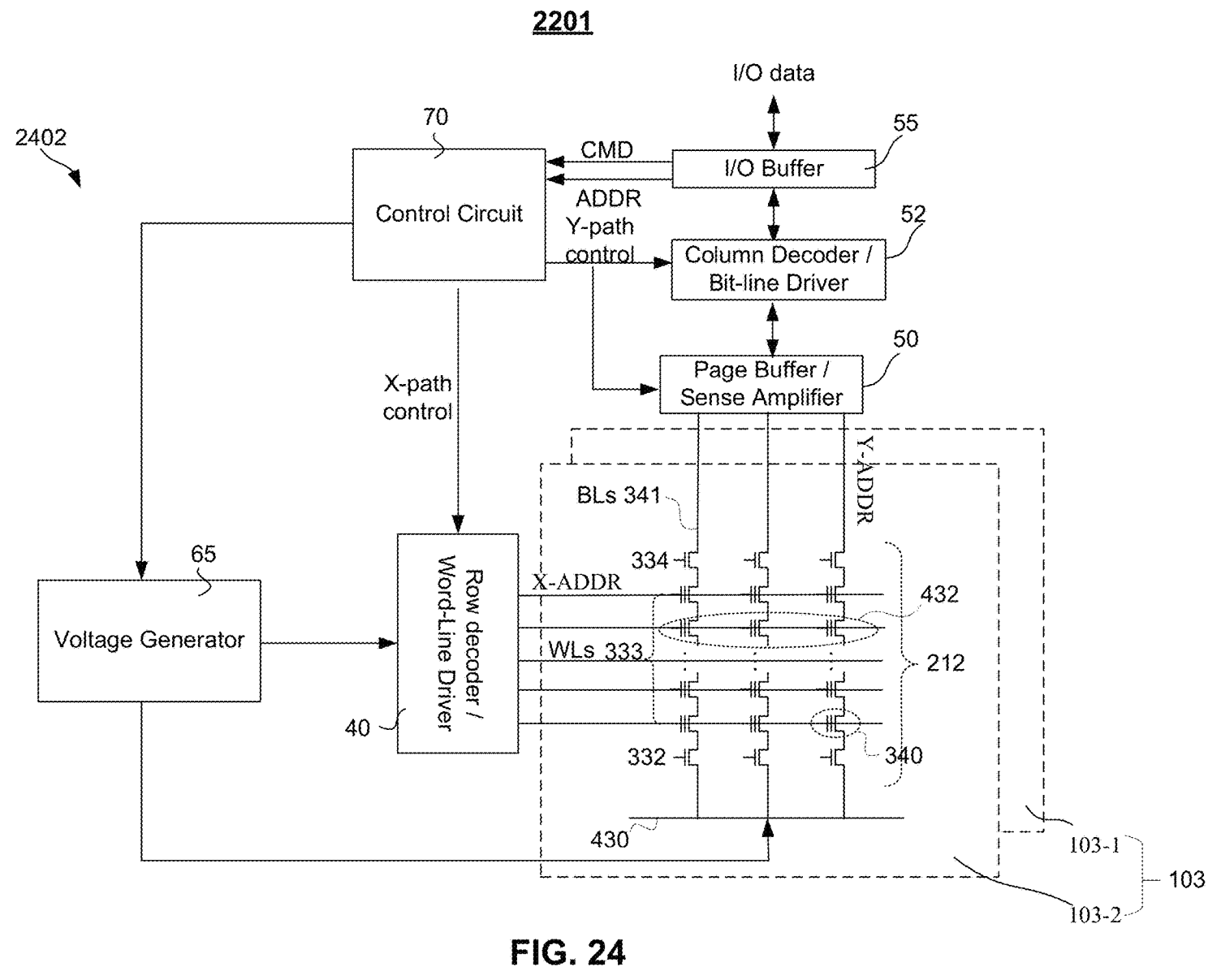

FIG. 24 illustrates a schematic diagram of the memory die 2201, according to some embodiments of the present disclosure. In one example, the memory die 2201 can include the 3D memory device 100 in FIG. 1 having the 3D memory array structure 300 shown in FIG. 3. In this example, the memory die 2201 can further include the 3D memory structure 2000 shown in FIGS. 20A-20D. In some embodiments, the memory die 2201 includes one or more memory blocks 103 (e.g., 103-1, 103-2). Each memory block 103 includes memory strings 212. Each memory string 212 includes memory cells 340. The memory cells 340 sharing the same word line forms a memory page 432. The memory string 212 can also include at least one field effect transistor (e.g., MOSFET) at each end, which is controlled by a bottom select gate (BSG) 332 and a top select gate (TSG) 334, respectively. The drain terminal of the top select transistor 334-T can be connected to the bit line 341, and the source terminal of the bottom select transistor 332-T can be connected to an array common source (ACS) 430. The ACS 430 can be shared by the memory strings 212 in an entire memory block, and is also referred to as the common source line.

The memory die 2201 can also include a periphery circuit 2402 that includes many digital, analog, and/or mixed-signal circuits to support functions of the memory block 103, for example, a page buffer/sense amplifier 50, a row decoder/word line driver 40, a column decoder/bit line driver 52, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

The memory blocks 103 can be coupled with the row decoder/word line driver 40 via word lines ("WLs") 333, bottom select gates ("BSGs") 332 and top select gates ("TSG") 334. The memory blocks 103 can be coupled with the page buffer/sense amplifier 50 via bit lines ("BLs") 341. The row decoder/word line driver 40 can select one of the memory blocks 103 on the memory die 2201 in response to a X-path control signal provided by the control circuit 70. The row decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

The column decoder/bit line driver 52 can transfer an inhibit voltage $V_{inhibit}$ to an unselected bit line and connect a selected bit line to ground according to a Y-path control signal received from the control circuit 70. In the other words, the column decoder/bit line driver 52 can be configured to select or unselect one or more memory strings 212 according to the Y-path control signal from the control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, the page buffer/sense amplifier 50 can sense current flowing through the bit line 341 that reflects the logic state (i.e., data) of the memory cell 340 and amplify small signal to a measurable magnification.

The input/output buffer 55 can transfer the I/O data from/to the page buffer/sense amplifier 50 as well as addresses ADDR or commands CMD to the control circuit 70. In some embodiments, the input/output buffer 55 can function as an interface between the memory controller 20 (in FIG. 1) and the memory die 2201 on the memory chip 25.

The control circuit 70 can control the page buffer/sense amplifier 50 and the row decoder/word line driver 40 in response to the commands CMD transferred by the input/output buffer 55. During the program operation, the control circuit 70 can control the row decoder/word line driver 40 and the page buffer/sense amplifier 50 to program a selected memory cell. During the read operation, the control circuit 70 can control the row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index, a block index and a plane index to identify the memory page 432, memory block 103, and memory plane 101 (in FIG. 1), respectively. The column address Y-ADDR can identify a byte or a word in the data of the memory page 432.

The voltage generator 65 can generate voltages to be supplied to word lines and bit lines under the control of the control circuit 70. The voltages generated by the voltage generator 65 include the read voltage $V_{read}$, the program voltage $V_{pgm}$, the pass voltage $V_{pass}$, the inhibit voltage $V_{inhibit}$, etc.

In summary, the present disclosure provides a method for forming a three-dimensional memory device. The method includes disposing an alternating dielectric stack on a substrate in a first direction perpendicular to the substrate; and forming a staircase structure and a dividing wall in the alternating dielectric stack. The staircase structure and the dividing wall extend in a second direction parallel to the substrate, and the dividing wall is adjacent to the staircase structure. The method also includes forming, sequentially on the staircase structure, a first barrier layer and a second barrier layer different from the first barrier layer. The method further includes forming a gate line slit (GLS) opening in the dividing wall. The GLS opening penetrates through the alternating dielectric stack in the first direction and is distant from the second barrier layer in a third direction that is parallel to the substrate and is perpendicular to the second direction.

The present disclosure also provides a three-dimensional (3D) memory device. The 3D memory devices includes a film stack having conductive layers and first dielectric layers alternatingly stacked on a substrate in a first direction perpendicular to the substrate. The 3D memory device also includes a staircase structure disposed in the film stack and extending in a second direction parallel to the substrate; and a dividing wall extending in the second direction and located adjacent to the staircase structure. The 3D memory device further includes a gate line slit (GLS) disposed in the dividing wall, wherein the GLS penetrates through the film stack in the first direction and extends in the second direction. The 3D memory device also includes a first barrier layer disposed on the staircase structure; and a second barrier layer disposed on the first barrier layer in a first region of the staircase structure, wherein the second barrier layer, different from the first barrier layer, is distant from the GLS in a third direction parallel to the substrate and perpendicular to the second direction.

The present disclosure further provides a memory storage system, including a three-dimensional memory device. The 3D memory device includes the features described above.

In the present disclosure, the second barrier layer (e.g., silicon nitride) can be used as an etch-stop to form contact openings for the staircase structure. By using a block mask, a portion of the second barrier layer located around the gate line slit can be removed prior to removing the second dielectric layers (e.g., silicon nitride) in the alternating dielectric stack. After pulling back the second barrier layer away from the gate line slit, the second barrier layer will not be replaced by a conductive layer, and a potential conductive path can thereby be avoided. Thickness of the second barrier layer will not be limited by the replacement process either. Accordingly, the performance and reliability of the 3D memory device can be improved.

The present disclosure also provides a three-dimensional (3D) memory die that includes a 3D memory device and a periphery circuit. The 3D memory device includes a film stack that has conductive layers and first dielectric layers alternatingly stacked on a substrate in a first direction perpendicular to the substrate; a staircase structure disposed in the film stack and extending in a second direction parallel to the substrate; and a dividing wall extending in the second direction and located adjacent to the staircase structure. The 3D memory device also includes a gate line slit (GLS) disposed in the dividing wall, wherein the GLS penetrates through the film stack in the first direction and extends in the second direction; a first barrier layer disposed on the staircase structure; and a second barrier layer disposed on the first barrier layer in a first region of the staircase structure. The second barrier layer, different from the first barrier layer, is distant from the GLS in a third direction parallel to the substrate and perpendicular to the second direction. The periphery circuit is coupled to the 3D memory device and is configured to support operations of the 3D memory device. For example, the periphery circuit may include functional devices such as page buffer/sense amplifier 50, column decoder/Bit-line driver 52, I/O buffer 55, voltage generator 65, control circuit 70, and row decoder 40.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
    a film stack, comprising:
        conductive layers and first dielectric layers alternatingly stacked on a substrate in a first direction perpendicular to the substrate;
        a staircase structure extending in a second direction parallel to the substrate; and
        a dividing wall extending in the second direction and located adjacent to the staircase structure;
    a gate line slit (GLS) disposed in the dividing wall, wherein the GLS penetrates through the film stack in the first direction and extends in the second direction;
    a first barrier layer disposed on the staircase structure; and
    a second barrier layer disposed on the first barrier layer in a first region of the staircase structure, wherein the second barrier layer, different from the first barrier layer, is distant from the GLS in a third direction parallel to the substrate and perpendicular to the second direction.

2. The memory device of claim 1, wherein the first barrier layer covers at least sidewalls of staircase steps of the staircase structure.

3. The memory device of claim 1, further comprising:
    an insulating layer disposed on the second barrier layer to cover a top surface and sidewalls of the second barrier layer.

4. The memory device of claim 3, further comprising:
    a contact structure, penetrating through the insulating layer, the second barrier layer and the first barrier layer in the first direction, wherein the contact structure is in contact with one of the conductive layers of the film stack.

5. The memory device of claim 1, wherein the first region is in a center of the staircase structure and extends in the second direction.

6. The memory device of claim 5, wherein the staircase structure further comprises a second region, wherein the second region of the staircase structure extends in the second direction and is positioned between the dividing wall and the first region.

7. The memory device of claim 1, wherein the first barrier layer comprises silicon oxide and the second barrier layer comprises silicon nitride.

* * * * *